(12) United States Patent
Clayton et al.

(10) Patent No.: US 7,796,399 B2
(45) Date of Patent: Sep. 14, 2010

(54) THIN MULTI-CHIP FLEX MODULE

(75) Inventors: James E. Clayton, Raleigh, NC (US); Zakaryae Fathi, Raleigh, NC (US)

(73) Assignee: Microelectronics Assembly Technologies, Inc., Research Triangle Park, NC (US)

( * ) Notice: Subject to any disclaimer, the term of this patent is extended or adjusted under 35 U.S.C. 154(b) by 0 days.

(21) Appl. No.: 12/317,892

(22) Filed: Dec. 30, 2008

(65) Prior Publication Data

US 2009/0168363 A1    Jul. 2, 2009

Related U.S. Application Data

(60) Provisional application No. 61/009,781, filed on Jan. 2, 2008.

(51) Int. Cl.
*H05K 1/18* (2006.01)
*H05K 7/20* (2006.01)
*H01R 12/24* (2006.01)
*H01R 43/02* (2006.01)
*H04L 12/50* (2006.01)
*H01L 23/34* (2006.01)

(52) U.S. Cl. ............ 361/764; 174/257; 361/719; 361/721; 361/722; 361/704; 361/803; 361/772; 361/760; 361/767; 439/496; 439/326; 370/360; 257/E25.011; 257/707; 29/860

(58) Field of Classification Search ............ 361/749, 361/760, 764, 767, 719, 803, 772, 714; 439/493, 439/326, 66, 77; 370/360; 257/E25.011, 257/E25.023, E25.177, E25.102, 686, 707, 257/723; 365/230.03
See application file for complete search history.

(56) References Cited

U.S. PATENT DOCUMENTS

| 4,656,605 | A | 4/1987 | Clayton |
|---|---|---|---|
| 4,727,513 | A | 2/1988 | Clayton |
| 4,850,892 | A | 7/1989 | Clayton |
| 5,661,339 | A | 8/1997 | Clayton |
| 5,708,297 | A | 1/1998 | Clayton |
| 5,731,633 | A | 3/1998 | Clayton |
| 6,049,975 | A | 4/2000 | Clayton |
| 6,091,145 | A | 7/2000 | Clayton |
| 6,232,659 | B1 | 5/2001 | Clayton |

(Continued)

FOREIGN PATENT DOCUMENTS

JP    3424929    2/1996

*Primary Examiner*—Zachary M Pape
*Assistant Examiner*—Jerry Wu
(74) *Attorney, Agent, or Firm*—Robert J. Lauf

(57) ABSTRACT

A multichip module comprises a multilayer substrate circuit having conductive patterns on its surface(s) to which microelectronic device(s) are attached. The conductive patterns include a series of electrical contacts adjacent to one edge of the substrate. The substrate is bonded to two rigid frames, one on each opposite surface. Each substrate has a series of castellations on one edge that are aligned and electrically connected to the respective contacts on the substrate, preferably by soldering. The castellations can serve as a self-aligning mechanism when the module is brought into contact with a low-profile pin array, and the module may be held in place on a motherboard by guide rails in a socket that engages the edges perpendicular to the castellated edge of the module. The module may further be provided with protective heat spreading covers.

11 Claims, 32 Drawing Sheets

U.S. PATENT DOCUMENTS

| | | |
|---|---|---|
| 6,501,661 B1 * | 12/2002 | Moore et al. .................. 361/752 |
| 6,665,190 B2 | 12/2003 | Clayton |
| 2006/0048385 A1 | 3/2006 | Cady et al. |
| 2006/0049500 A1 | 3/2006 | Goodwin |
| 2006/0049502 A1 | 3/2006 | Goodwin et al. |
| 2006/0049512 A1 | 3/2006 | Goodwin |
| 2006/0049513 A1 | 3/2006 | Goodwin |
| 2006/0050488 A1 | 3/2006 | Goodwin |
| 2006/0050489 A1 | 3/2006 | Wehrly et al. |
| 2006/0050492 A1 | 3/2006 | Goodwin et al. |
| 2006/0050496 A1 * | 3/2006 | Goodwin .................... 361/803 |
| 2006/0050497 A1 | 3/2006 | Goodwin |
| 2006/0050498 A1 | 3/2006 | Cady et al. |
| 2006/0050592 A1 | 3/2006 | Cady et al. |
| 2006/0053345 A1 | 3/2006 | Goodwin |
| 2006/0055024 A1 | 3/2006 | Wehrly |
| 2007/0211426 A1 | 9/2007 | Clayton et al. |
| 2007/0211711 A1 | 9/2007 | Clayton et al. |
| 2007/0212902 A1 | 9/2007 | Clayton et al. |
| 2007/0212906 A1 | 9/2007 | Clayton et al. |
| 2007/0212919 A1 | 9/2007 | Clayton et al. |
| 2007/0212920 A1 | 9/2007 | Clayton et al. |

* cited by examiner

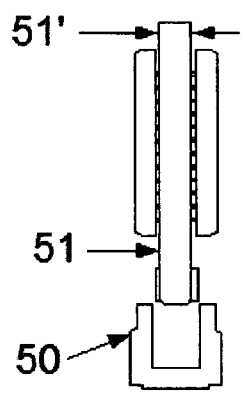
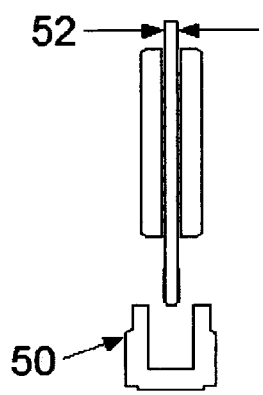
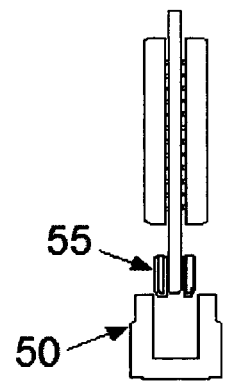
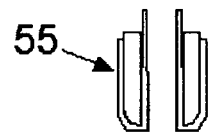
FIG 1A　　FIG. 1B　　FIG. 1C　　FIG. 1D
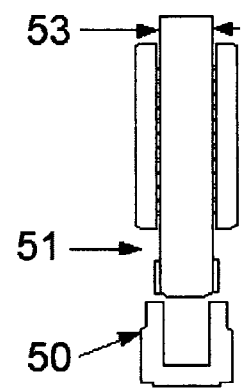
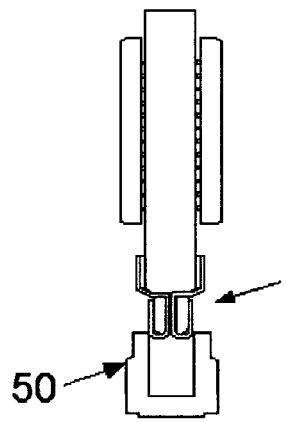
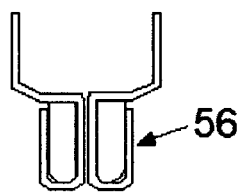
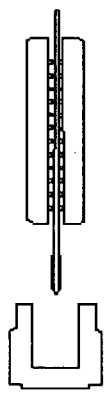
FIG. 1E　　FIG. 1F　　FIG. 1G　　FIG. 1H
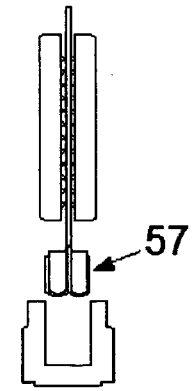
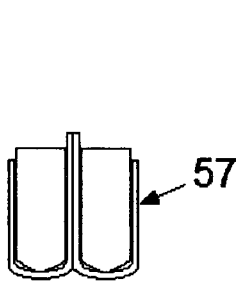
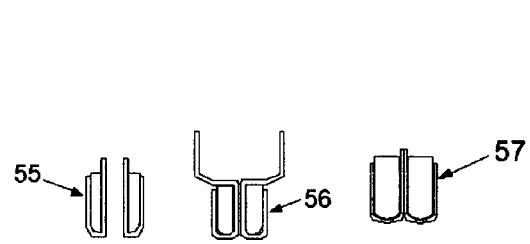
FIG. 1J　　FIG. 1K　　FIG. 1M

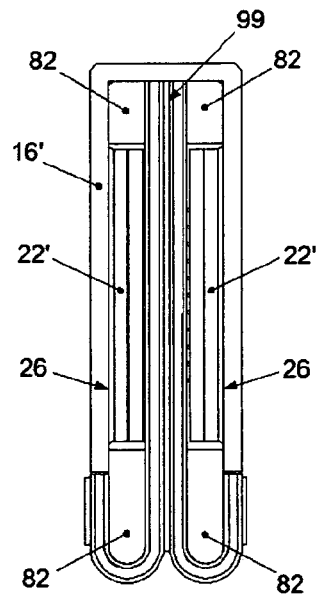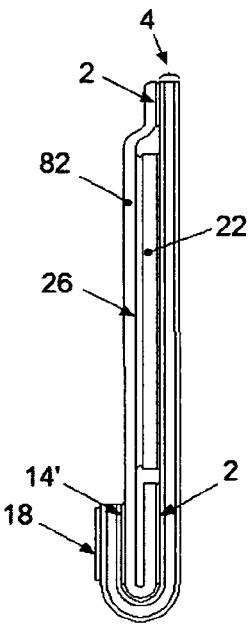
FIG. 12 A          FIG. 12B
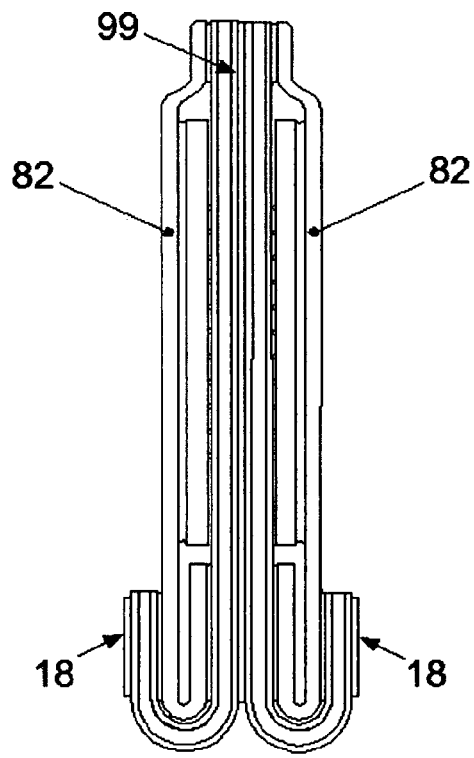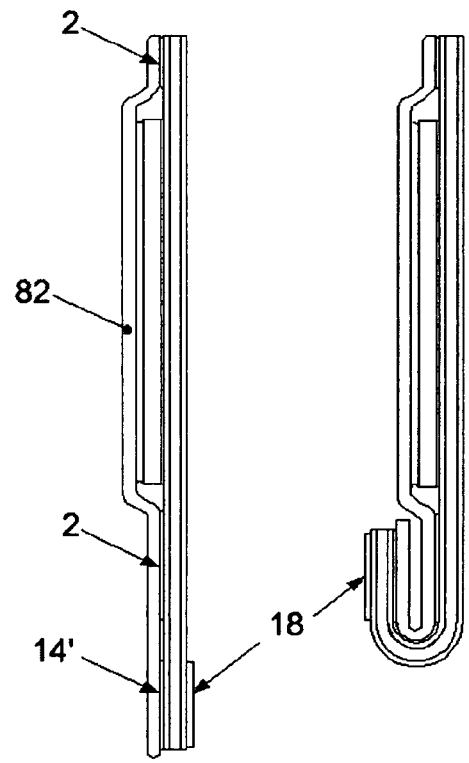
FIG. 12C          FIG. 12D          FIG. 12E

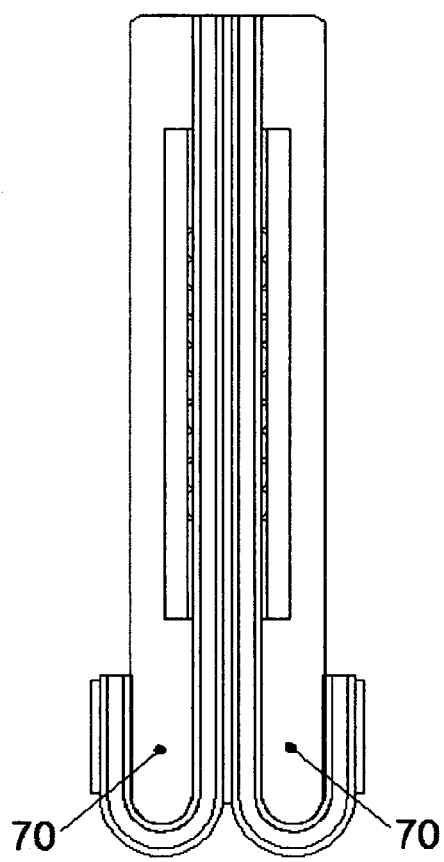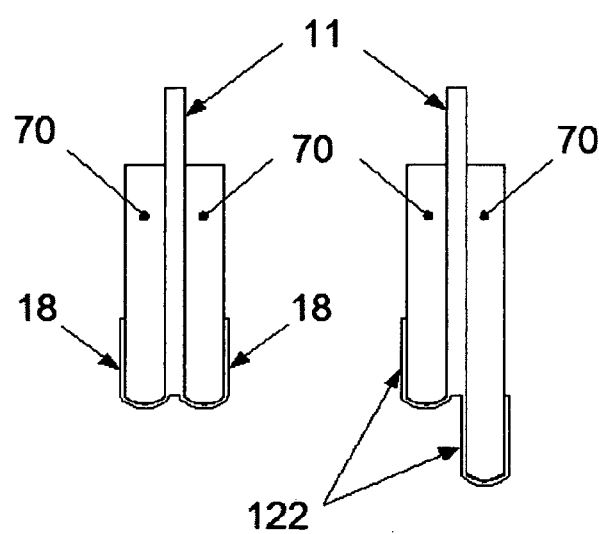
FIG. 17
FIG. 18

THIN MULTI-CHIP FLEX MODULE

CROSS-REFERENCE TO RELATED APPLICATION

This application claims the benefit of Provisional Patent Application No. 61/009,781 by the present inventors, filed on Jan. 2, 2008, the entire disclosure of which is incorporated herein by reference.

BACKGROUND OF THE INVENTION

1. Field of the Invention

The present invention relates generally to means for packaging microelectronic devices and multichip modules. More particularly, the invention relates to improved flex-circuit solutions for SIMM and DIMM type memory modules and other modular electronic circuits.

2. Description of Related Art

High density computing is continually evolving to offer high performance devices with higher densities and smaller form factors. Servers are designed with these goals in mind and are key enablers for various computing applications. Servers contain, among other electronic components, microprocessors and memory modules, which generate considerable heat during operation. Currently higher performance servers make use of dual and quad core microprocessors. In turn, these microprocessors require memory modules with greater memory capacity for optimal performance.

Another important aspect of server design is that servers are often arranged in closely packed groups set in vertical racks that rely on forced air cooling for heat exhaust. So, air cooling is done for each server unit as well as the entire rack of server units. When multiple memory modules are tightly spaced together inside the tightly packed server chassis, the circulation of air as a cooling fluid becomes ineffective. Air can be restricted, leading to overheating of memory modules which in turn leads to premature failures including device failures and corrupt data streams.

The desirable attributes of the best memory modules include: high memory density, reduced thickness, reduced height, good thermal exhaust, good signal integrity, reliability, manufacturability and reduced cost. These characteristics are inter-related and the optimization of one may adversely impact the other; so, a balance must be found among these various characteristics to determine the most effective solution. The most effective solution may be relative to a given memory density. In other words, the most effective memory module solution at 2 GB or 4 GB may be different than the solution for 8 GB and 16 GB modules. Furthermore, the best DIMM solution for DDR2 DRAMs may be different than the best DIMM solution for DDR3 and DDR4 DRAMs since the standards are slightly different.

Increasing memory density inside a module can be achieved through stacking of chips. However, stacking of chips is accompanied by an increase in cost of the stacked chips. Also, stacking of chips is accompanied by greater heat that is concentrated between the stacked chips and is more difficult to dissipate which leads to an overall hotter module. Additional heat exhaust can be obtained through the use of heat spreaders or heat sinks. However, the addition of larger heat sinks and heat spreaders is accompanied by an increase in thickness. In turn, increasing thickness leads to a pressure drop between adjacent modules which impedes the flow of air and adversely affects cooling. The words heat spreaders and heat sinks are used interchangeably in this invention.

Thickness reduction can be achieved through the use of thin laminates and flexible circuits. However, flexible circuits can be more expensive than standard PCB based on FR4 materials. Furthermore, thickness reduction causes a mismatch between the thin laminate or the flexible substrate and the standard connector.

As previously taught by J. E. Clayton in a series of patents detailing the use of flexible circuits for memory modules (U.S. Pat. No. 6,665,190, U.S. Pat. No. 6,232,659, U.S. Pat. No. 6,091,145, U.S. Pat. No. 6,049,975, U.S. Pat. No. 5,731,633, U.S. Pat. No. 5,751,553, U.S. Pat. No. 5,708,297, U.S. Pat. No. 5,661,339, 2007/0211426A1, 2007/0212902A1, 2007/0212919A1, 2007/0211711A1, 2007/0212906A1, 2007/0212920A1) the design for the optimal thermal path puts the chip in a configuration that optimizes the heat path between the heat generation source and the metallic heat sinks and heat spreaders. However, when the chips are in an optimal heat path configuration, they may not be in an optimal electrical path configuration.

Flexible circuits exhibit many desirable attributes that lend themselves to solving many electronic packaging problems. Because they are constructed using thin flexible laminates, flexible circuits can be adapted into a large variety of three-dimensional configurations. In particular they are uniquely suited for joining two separate circuit components that involve repeated dynamic flexing motions such as when opening and closing cell phone, camera and notebook LCD displays.

Flexible circuits are also used in applications where reduced thickness or curved surfaces are important. Many mobile products produced today are made feasible by the unique characteristics inherent with flexible circuits. For background purposes, a fairly comprehensive description of flexible circuit technology, including construction methods, design and application specific examples may be found in a book authored by Dr. Joseph Fjelstad entitled "Flexible Circuit Technology" ($3^{rd}$ Edition—September 2006) the teaching of which is incorporated herein by reference in its entirety. Another reference on flexible circuits is "Coombs' Printed Circuits Handbook—Fifth Edition" by Clyde F. Coombs, Jr., the teaching of which is incorporated herein by reference in its entirety. Lastly, "Foldable Flex and Thinned Silicon Multichip Packaging Technology" edited by John W. Balde, is incorporated herein by reference in its entirety.

High performance computers, such as server and super computers, involve many dense, high frequency electrical connections where flexible circuits may be advantageously employed. Their thin uniform laminate thickness, ability to be fashioned with fine lined traces and small vias for layer-to-layer interconnections are better suited for higher frequency operation than traditional rigid printed wiring boards (PWB).

As clock frequencies increase with each succeeding generation of microprocessors, there is an increasing need to design circuit motherboards using techniques for controlled impedance and signal integrity. Usually this results in an increase in the layer count of rigid PWB circuit boards. Computer motherboards that could previously be designed with only 4 or 6 laminate layers now require 8 or more layers to properly route traces operating at higher clock rates. This may increase the cost of these special PCBs.

Using finer wiring patterns, flexible circuits can significantly reduce the number of required layers to form the same circuit functions. Rigid PWB motherboards are, nevertheless, presently required for mounting many hardware pieces such as power supplies, disc drives, fans, and component sockets and are therefore in no danger of being eliminated in the foreseeable future. However, the advantages of flexible circuits, as noted above, are leading many engineers to look for creative ways in which to include them in their designs. Examples developed by SiliconPipe are described by co-founder Dr. Fjelstad and illustrated on pages 32 and 33 of the reference text "Flexible Circuit Technology" cited above.

Although the use of flexible circuits in packaging semiconductors and consumer electronics is well known and offers the capability of high density interconnect signal stability at high frequencies, and flexible form factor (connecting sites that are not aligned), the technology based on flexile circuits is not without disadvantages. Flexible circuits present an overall cost disadvantage, they are inherently a non-rigid form factor and need structural members to be incorporated. Furthermore, the technology needs special design talent for high performance, reliability and operation at high frequencies. One of the challenges caused by the use of flexible circuits is that it reduces the thickness of the substrate to the point that it becomes incompatible with current standard connectors.

Multi Chip Modules (MCM) have a known form factor with known advantages and disadvantages. The advantages of thickness reduction in DIMM applications are increase air flow and space savings on the mother board. However, solving the thickness issues create other issues. Thickness reduction can be achieved by the use of Thin PCB, Rigid Flex, Flex circuitry (connected to standard PCB connector), or by using Flex circuit exclusively.

The thickness of a PCB can be reduced as is the practice of companies such as Eastern Company. These thin laminates can reduce thickness of the PCB but may not be good for high density modules and high frequency operations due to the limited number of layers they utilize and their dielectric properties. However, when thin PCB laminates are used a transition between the thin laminate and the wider DIMM connector is needed.

OBJECTS AND ADVANTAGES

It will be appreciated that the most effective module solution may not necessarily be the best in any one particular performance attribute, but rather offers the best overall solution at a given density and DRAM clock speed. Objects of the present invention include at least the following: providing effective solutions for thickness reduction in electronic modules; providing electronic modules that are thinner and more cost effective; providing electronic modules suitable for placement at higher densities; providing improved memory modules for computing applications; providing improved memory modules for blade servers; and, providing a method for manufacturing electronic modules that is cost effective and allows for rework.

Additional objects of the invention include providing a means for efficient thermal communication between the enclosed integrated circuit devices and the exterior surfaces of the thermally conductive shell in an electronic module; maintaining the shortest thermal path from the surfaces of the enclosed chips to the ambient air outside an electronic module; adapting a portion of an interconnecting thin flexible circuit or thin printed circuit board to provide exterior contact pads for electrical and mechanical mating with existing DIMM type sockets; adapting electronic modules with stackable connections whereby modules may be stacked in vertical and/or lateral configurations; and, providing an improved means for locating passive components in circuit modules. These and other objects and advantages will become apparent from reading the specification in conjunction with the accompanying drawings, which are not necessarily drawn to scale.

SUMMARY OF THE INVENTION

In accordance with one aspect of the invention, a multichip module comprises: a flexible multilayer dielectric substrate having a first surface and a second surface; a conductive pattern on the first surface, the conductive pattern including a plurality of contacts adjacent to one edge of the substrate; a conductive pattern on the second surface, the conductive pattern including a plurality of contacts adjacent to the same one edge of the substrate; a plurality of microelectronic devices attached to the substrate and operably coupled to the conductive patterns; and, two substantially rigid frames extending around the periphery of the dielectric substrate, one on each of the first and second surfaces, the frames having a plurality of metallized castellations aligned with and electrically connected to respective contacts on the substrate.

In accordance with another aspect of the invention, a method for making a multichip module comprises the steps of:

forming a flexible dielectric substrate having a first surface and a second surface;

forming a conductive pattern on the first surface, the conductive pattern including a plurality of contacts adjacent to one edge of the substrate;

forming a conductive pattern on the second surface, the conductive pattern including a plurality of contacts adjacent to the same one edge of the substrate;

attaching a plurality of microelectronic devices to the substrate and operably coupled to the conductive patterns; and, attaching two substantially rigid frames extending around the periphery of the dielectric substrate, one on each of the first and second surfaces, the frames having a plurality of metallized castellations aligned with respective contacts on the substrate.

BRIEF DESCRIPTION OF THE DRAWINGS

FIG. 1 illustrates schematically several ways in which a bifurcated flex according to the invention can be used to make an up-transition between a thin circuit and a wider socket.

FIG. 12 illustrates schematically various configurations of a protective metal frame in accordance with several aspects of the invention.

FIG. 17 illustrates schematically a flex module in which the bifurcated flex is disposed within a molded plastic frame in accordance with one aspect of the invention.

FIGS. 18-20 illustrate schematically various arrangements of a bifurcated flex according to the present invention, including both symmetrical and asymmetrical configurations.

DETAILED DESCRIPTION OF THE INVENTION

Figure 2A:
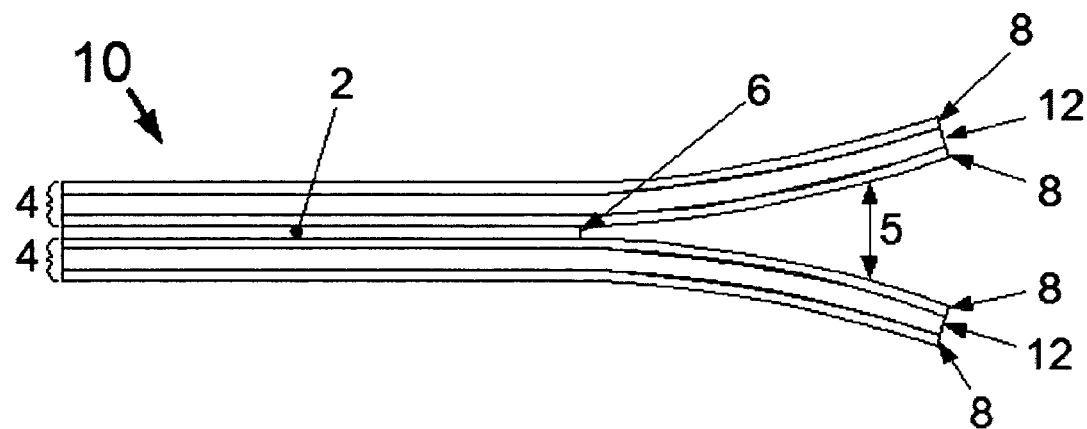
FIG. 2 illustrates schematically a bifurcated flex according to the present invention in which two metallized flex layers are bonded over a portion of their respective areas and not bonded over another portion.

The present invention addresses the designs of effective solutions to optimize the offering and differentiation for thickness reduction, module densities and relative cost effectiveness. These parameters are balanced per density requirement. For instance, a design that can meet and optimize the attributes of a memory module at the low densities (2 GB and 4 GB) can use a central flexible circuit that places the chips in a mirror image configuration and that offers the benefit of using a lesser amount of flexible circuit and hence enables lower cost. Chips in a mirror image around a flex enable simpler electrical design. Furthermore, the centrally-located flex reduces thickness and when coupled with other features in the current invention (including those features dealing with signal length symmetry, grounding strategies, and the connection interface), would produce an extremely thin and relatively cost effective solution at the low densities.

Skilled artisans will appreciate the value of reducing the thickness of an electronic module. Reducing the module thickness allows cooling air to flow more freely between the modules and to pass through and over other components behind the modules that would otherwise be "shadowed" from the cooling fluid. The thickness of the memory module is presently dictated by the thickness of the PWB substrate, the thickness of the memory packages mounted on the substrate's surfaces, and more recently the additional thickness imposed by bulky heat sinks. These heat sinks are typically clipped over both sides of the module.

Reducing IC packaging thickness is a continuing trend, but appears to have reached a practical limit. Another solution presently being developed is to stack multiple memory devices within the same package dimensions. However, assembly yield, and hence cost, are adversely effected, and stacked memory devices tend to cause more heat to be generated and concentrated between the memory devices themselves.

A solution is provided in this invention by substantially reducing the substrate thickness, allowing the memory components to be positioned closer to the centerline of the module, and incorporating the heat sink 16 (herein referred to as a heat spreader or exterior metal shell or metallic enclosure or stiffener plate(s)) as an integral part of the module to compensate for the reduced rigidity of the thinner substrate. The metal walls in the metal shell serve multiple purposes (chip protection, heat spreading, connector, stiffening, interface, grounding and assembly). In addition to enabling a significant reduction in overall thickness, this invention also provides a robust yet lightweight enclosure for protecting minimally packaged and/or unpackaged, "bare" silicon memory devices that otherwise would be exposed to handling damage if assembled on the exterior surfaces of conventional DIMM substrates. The standard IC devices are typically individually pre-packaged devices (e.g. FBGA, PBGA, CSP, etc.), but the use of unpackaged bare silicon chips (e.g. wafer-level RDL, flip chip, DCA, etc.) would be preferred if its use is made possible and practical. Wafer Level Packaging of semiconductors can achieve very small and cost effective semis packaging form factors. Bare silicon memory devices represent the ultimate minimalist design or thinnest form factor since they are not surrounded with conventional molding compounds that are typically used to house and protect IC components. But the industry has grown dependant on pre-packaged components as a means for handling and testing memory devices to various grade levels.

Recent advancements in wafer probing and testing technology may soon enable the long sought goal of a reliable, high volume supply of Known Good Die (KGD) to the industry. The present invention enables the construction of a standard memory module specifically designed to enclose and protect these fragile KDG memory devices in order for the technology to advance. The package-less die leads to savings at the chip level. This saving per unit silicon is multiplied by the number of placements at the module level which leads to significant savings when the module has 18 placements, 36 placements, 72 or 144 placements.

It will be appreciated that although the present invention represents a significant departure from prior electronic module manufacturing practice, it is clearly sufficiently "manufacturable" to become qualified through recognized industry standardization processes, particularly for memory modules. The invention can enable memory device manufacturers and third party module manufacturers to assemble finished module products directly from memory wafers without the necessity of pre-packaging each individual die first, resulting in a considerable savings in cost and process steps. This is a significant cost reduction for DRAM manufacturers compared to the existing art. By reducing cost and assembly time for DRAM manufacturers, the invention is expected to be a significant enabler of a revolutionary "package it once" trend within the industry Furthermore, significant cost savings can be achieved by the DRAM manufacturers from an operational stand point by eliminating the packaging operations within the organization and by aligning themselves closer to a Just-In-Time business model.

Another advantage of the invention is to significantly reduce the mounted height of the module. Reducing the mounted height allows these modules to either fit into products that are very restricted in height, such as blade servers and mobile devices, or to add more memory inside the module as a result of a net gain in component space. The reduction in module height is achieved by means of a unique contact architecture enabled by this invention that allows the seating plane to be reduced in the DIMM socket, as detailed below.

The direct module attachment to mother boards enables the reduction in parasitic signals and high bus speed through reduction of contacts and transitions. Some of the module interfaces described in this invention are applicable to high speed and large bandwidth electronics. The benefit at the mother board level is the reduction of large holes in the motherboard that may inflict speed penalties. By eliminating the standard connectors that are soldered at the mother board level, and by changing the signal routing at the motherboard level, we enable the optimization of high frequency designs that are more stable and scalable with future requirements. It recognizes that the designs of the novel module designs are coupled or done in conjunction with signal routing layout changes at the mother board level. By adopting flexible circuits at the module level, we also enable better signal integrity, wider voltage margins and more thermal stability compared to module on circuit board alternatives.

The present inventions can be expanded beyond memory modules. In some cases the ICs residing in the modules described in the present inventions can be a combination of logic and memory devices. Certain aspects of the present invention teach and describe the concepts of Total System in Module (TSIM) or the "brain", whereby memory and microprocessors reside in one very thin module/card suitable for the mobile market. The up-grade of a mobile device may then be done through the replacement of the thin module containing the TSIM.

Another advantage of the invention is to achieve higher density through stacking at the module level not just at the chip level. In either the standard height version or the reduced module height version with zero seating plane, the connection between two modules is engineered to enable the stacking and entering into a functional state of electrical continuity when inserted (or engaged) into one another.

The solution to the desirable target thickness reduction and the other desirable characteristics can be achieved by two distinctly fundamental ways. In one solution the thickness advantage is achieved and the connector interface is built using a standard PCB. The second solution achieves the goal using an alternate connection method through the use of bifurcated flex as the interface with the standard connectors. Both these innovative aspects are addressed in the current disclosure.

One of the desirable attributes of this invention is to achieve a multichip module of minimum thickness for enclosing integrated circuit (IC) devices. In order to achieve minimum thickness, these devices are preferably interconnected by a thin flexible circuit or thin printed circuit board placed at the center vertical axis of the module. The IC devices can be individually pre-packaged devices (e.g. FBGA, µBGA, CSP, etc.), but are preferably unpackaged bare silicon chips (e.g. wafer-level RDL, flip chip, DCA, etc.) in order to achieve minimum thickness of the module and reduce cost per chip unit as well as per the number of placements on the module.

Another desirable attribute is to provide a rigid, integral, thermally conductive outer shell which forms an interior cavity within the module to protect the integrated circuit devices and interconnecting substrate contained within. It will be appreciated that this outer shell may have multi-purpose functionality. The outer shell can: a) serve electrical functionality for extending the module grounding plane; b) serve as the assembly carrier for the module; and c) be shaped to mate with the connector.

According to one aspect of the present invention, card edge connectors are fashioned using bifurcated sections of flexible circuits, intended for insertion into a socket. A flexible circuit is sandwiched in the middle between two elongated, substantially rigid (preferably dielectric) stiffener plates 16 with bifurcated flex circuit sections extending some distance along the outer surfaces of the stiffener plates. The stiffener plates can either be flush at their respective edges or staggered, FIG. 17. The bifurcated sections of the flex circuits contain socket contact pads disposed on their surfaces in such a way as to be exposed when the free ends of the bifurcation are reflexed back upon the stiffener plates and bonded into position, or when extended parallel to the exposed surface of a staggered stiffener plate and bonded in place, FIGS. 18, 19. It will be appreciated that the rigid dielectric stiffener plates may be substantially simple rectangular prisms. Alternatively, they may contain tapers, bevels, chamfers, or radii for various purposes including reducing stress concentrations in the flex, guiding the contact strip into a socket, or providing enhanced physical contact. Some contemplated geometrical variations are shown in cross section in FIGS. 1D, 1G, 1K, and 1M. Sockets intended to engage with the various embodiments of these inventions may be conventional DIMM type sockets 50 or they may be fashioned from similar arrangements of bifurcated flexible circuits with pads containing raised metal bumps, FIGS. 20, 21. The flexible circuit sections of the mating sockets are likewise bonded to stiffener plates in a manner that enables the card edge connector, whether male or female, to securely engage with its respective socket, whether male or female. Raised metal bumps may be disposed on the flexible circuit pads of either the card edge connectors or mating socket or both. Alternatively, owing to the compliant nature of the flex material, raised metal bumps on the surface of the flex pads may be formed using protruding structures that are formed on the surfaces of the stiffener plates and which are positioned to lay beneath the bonded flex circuit section pads.

One aspect of the invention involves the use of a bifurcated flex to provide the connecting transition between a thin laminate to a standard DIMM connector 50. This transition is called an Up-transition to reflect going from thin to thick. A standard DIMM PCB substrate 51 thickness for 5V operation is 1.27 mm, FIG. 1A. The standard PCBs have lateral pads that mate with the pins inside a standard DIMM Connector, FIG. 1. However, when a thin laminate PCB 52 is substituted it will not properly mate with a standard DIMM connector across its width, FIG. 1B. A solution to bridging a thin laminate circuit to a larger width connector is achieved through a flex circuit transition 55, FIG. 1C, across the width and length of the module. Since the transition in this case is made from thin to thick, it is called an up transition, FIG. 1D.

It will be appreciated by skilled artisans that the flex portions used for an up transition or a down transition are made with impedance matching capability between the two portions to be connected or engaged.

It is conceivable that high frequency designs may require an increase in the number of layers in the PCB 53, FIG. 1E. A down transition 56 is therefore contemplated, whereby a flexible circuit mates with each pad to reduce the effective thickness at the connector portion, FIGS. 1F & 1G. Thin PCB laminates 52 reduce the thickness, FIG. 1B, but not as much as flexible circuits, FIG. 1H. Flexible circuits, however, need a transition 57 to mate with standard connectors as well, FIG. 1J. A solution similar to the one described for thin laminates can be used, FIG. 1K. However, the present invention provides a better solution in the form of a bifurcated flex where the adhesive in the center of the laminate is discontinuous and allows the flex circuit to be parted into two distinct laminae that may provide a reference ground plane as well as the appropriate signal layers.

The flex bifurcation in this invention may also achieve other purposes as will be described in the following examples.

Bifurcated Flexible Circuit:

In some applications the flexible circuit is a multilayer structure that consists of multiple dielectric core films with patterned copper traces on one or both surfaces of the dielectric core to form a single flex circuit ply. Separate patterned plies of copper/dielectric sheets can then be laminated together with various adhesives materials to form a multilayered flexible circuit. In some applications it is desirable to limit the adhesive joining the separate flexible plies of a multilayer circuit to be discontinuous. This technique is commonly employed to allow individual plies to be separated apart and connected to different locations on the circuit board. For background purposes, examples of discontinuous plies are illustrated in FIGS. 1-4 of page 8, the bottom figure of page 24, FIG. 5-5 and 5-6 of page 80 and FIG. 6-20 on page 143 of the reference book "Flexible Circuit Technology".

Figure 2B:
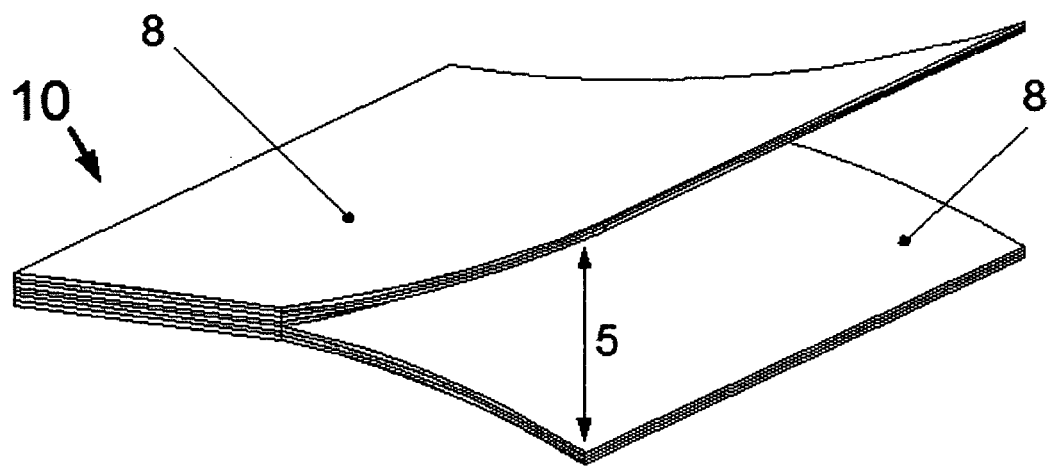

For purposes of this application Applicants use the term "bifurcated" to distinguish between other methods for separating flexible circuits. FIG. 2 illustrates a bifurcated multilayer flexible circuit 10. When a discontinuous adhesive 2 is formed within a multilayer flex circuit, the individual plies 4 are separable 5 beginning at a point 6 within the plane of the circuit's thickness. For example, if a four-layer flexible circuit, as shown in FIG. 2, is fashioned using two separate plies 4 with copper patterns 8 disposed on both surfaces of each polyimide core dielectric 12 and the adhesive 2 bond that joins the separate plies at the center-plane is discontinuous, then the two plies can be spaced apart 5 beginning at a point 6 in the center-plane where the adhesive is discontinuous. In the example shown the flexible circuit is "bifurcated" into two separate plies with double-sided copper films. Applicants distinguish a "bifurcated" flexible circuit from a "split" flexible circuit in which the circuit is cut through all laminate layers in a vertical axis, as believed to be represented in FIG. 2-27 of page 33 in the referenced text.

In some applications the flexible circuit is adhesively bonded to a rigid stiffener such as a plastic or metal plate without any direct electrical contact with the object providing a rigid mounting surface. An example would be a thin flex circuit bonded to a metal heat spreader for cooling one or more chips.

Figure 3:
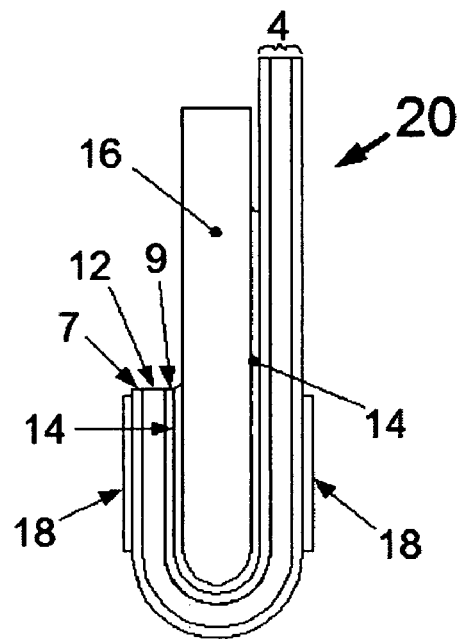
FIG. 3 illustrates schematically the prior art in which a single flex is wrapped around a supporting member, with electrodes on the outer surface(s).

FIG. 3 is an illustration of prior art showing how an edge card connector 20 can be fashioned by wrapping a single ply 4 in a unidirectional manner around the edge of a stiffener 16 and bonding the flexible circuit with an adhesive material 14 such that electrical contact pads 18 are arrayed along both top and bottom edges of the stiffener. The contact pads may be electrically connected to either the outer 7 or interior 9 copper patterns 8 of the flex circuit ply using plated via holes (not shown) cut through the dielectric core 12.

The example shown in FIG. 3 was the state of the art taught by J. E. Clayton and requires all electrical signals associated with the left pads to be routed across a longer distance than signals associated with the right contact pads. Extra trace length is required to bring the signals around the edge or nose of the stiffener and past the right contact pads. Although the extra trace length may be inconsequential for many lower frequency applications, at high operating frequencies this extra length may become a problem. Furthermore, at high frequencies better grounding designs are needed. Therefore, designs that enable high frequency performance as well as signal symmetry are preferred. The current invention leads to these solutions with extended grounding planes, signal symmetry, and equidistant traces.

Signal Symmetry through Bifurcation

Figure 4:
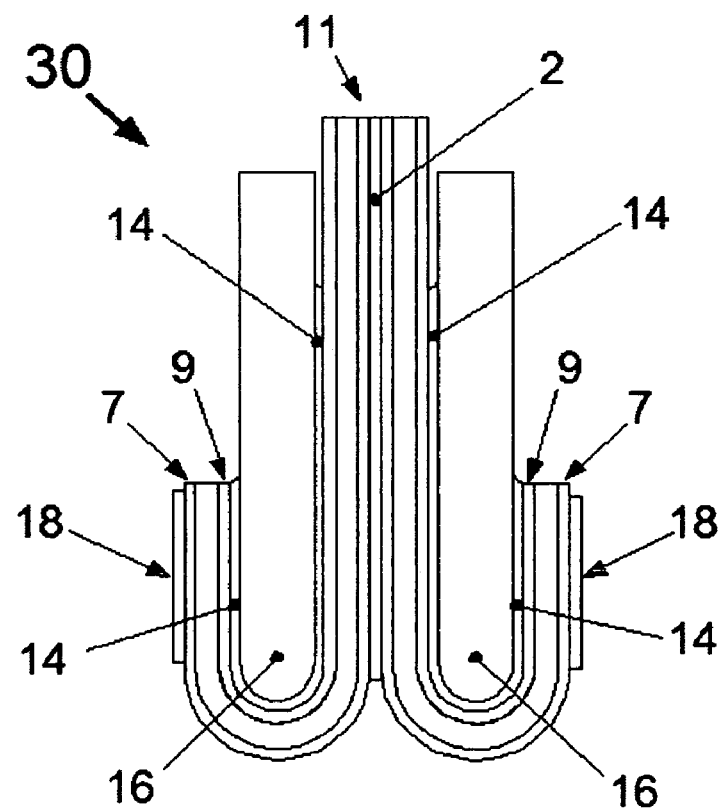
FIG. 4 illustrates schematically a bifurcated flex in which the free (unbonded) portions are reflexed and provided with electrodes in accordance with one aspect of the invention.

An improvement over the aforedescribed prior art is illustrated in FIG. 4. In this example a central bifurcated multilayer flexible circuit with external contact pads 11 enables the separate plies to be wrapped in opposite directions (i.e. bidirectional manner) outward and backwards around the ends of two stiffeners 16 that surround and enclose the multilayer flex circuit from both sides. As shown, this can be used to produce a card edge connector using a bifurcated flex circuit 30. In this example the signal paths are balanced and of the same trace length.

Figure 5:
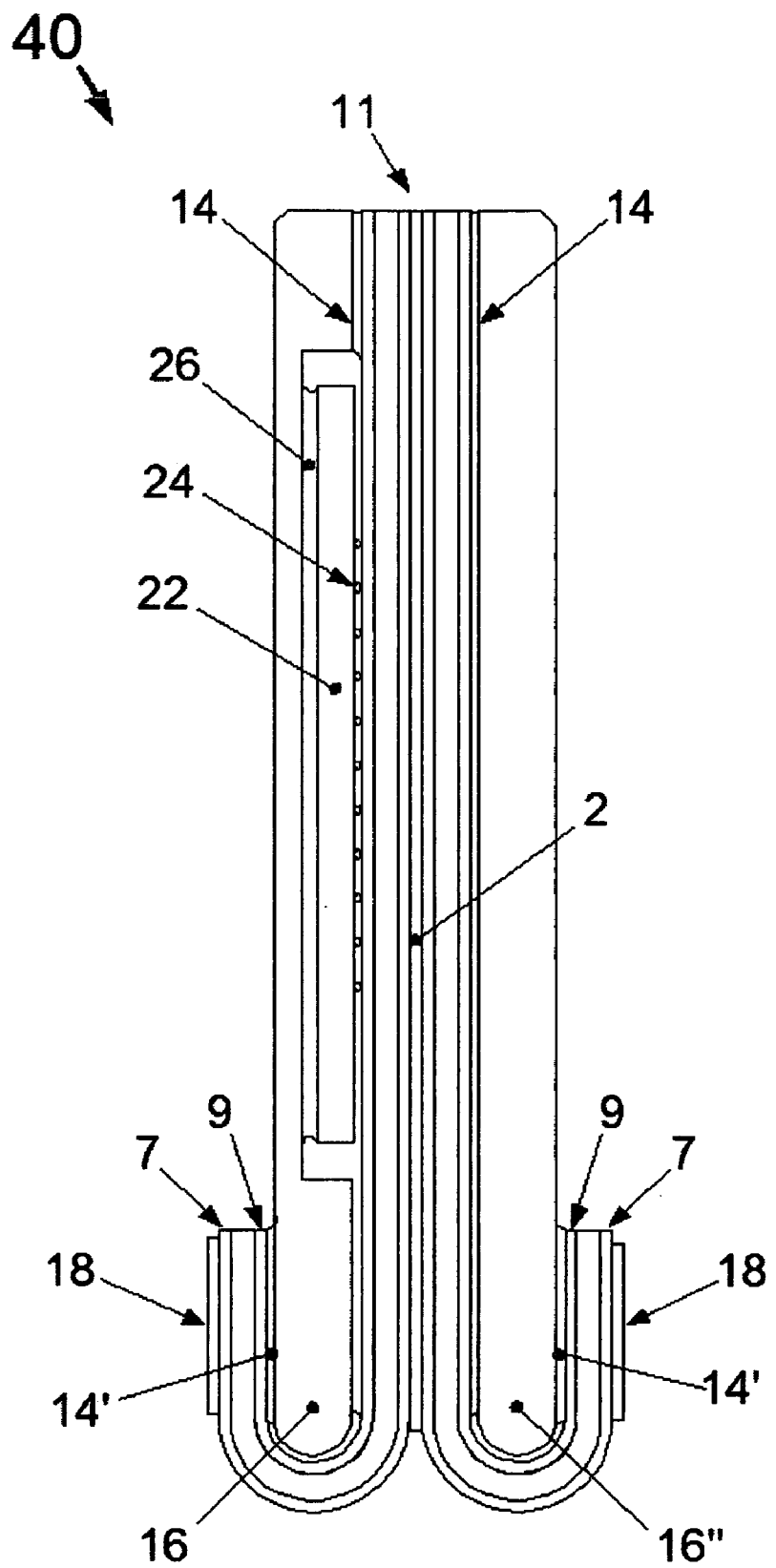
FIG. 5 illustrates schematically in cross section a flex module in accordance with one aspect of the invention.

When a chip 22 is connected to a flexible circuit, a stiffener is needed to give the assembly structural integrity, FIG. 5. The stiffener can be from one side or from two sides. For the purpose of this invention, a double-sided stiffener is needed. The stiffener that is on the chip side is preferably designed with a recessed portion to allow the chip to nest inside a cavity. This cavity protects the chip and enables the use of a KGD—a package-less chip. Alternatively, the back stiffener can be solid 16″. The dimensions of the stiffeners are preferably such that when combined with the thickness of the adhesives and the thickness of the plies, the total thickness is compatible with the width of a standard connector 50.

Figure 6A:
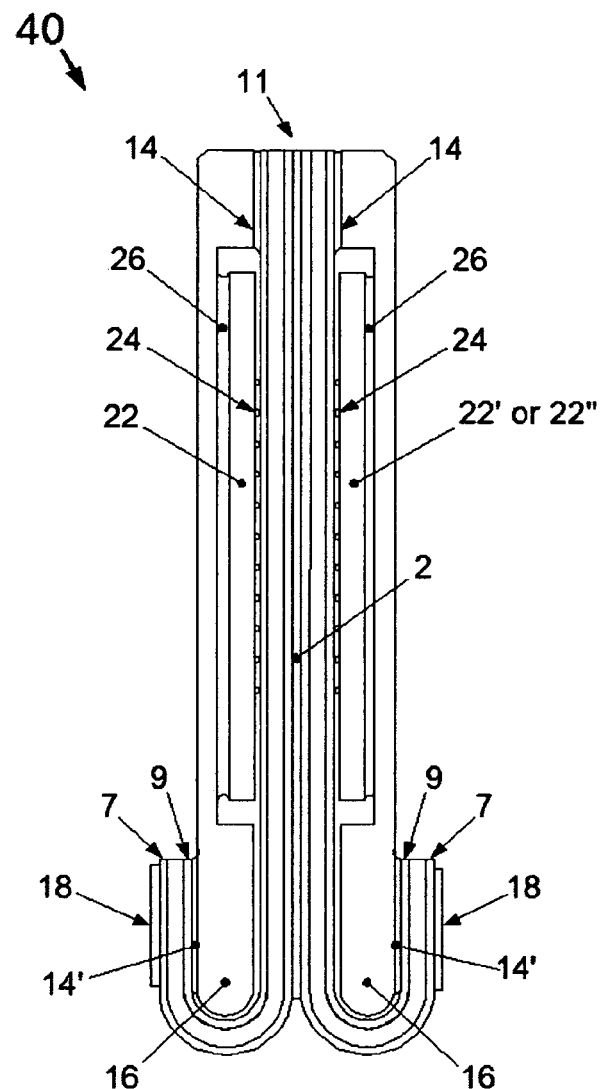
FIG. 6 illustrates schematically in cross section another flex module in accordance with one aspect of the invention, illustrating an alternative sequence of construction.
Figure 6B:
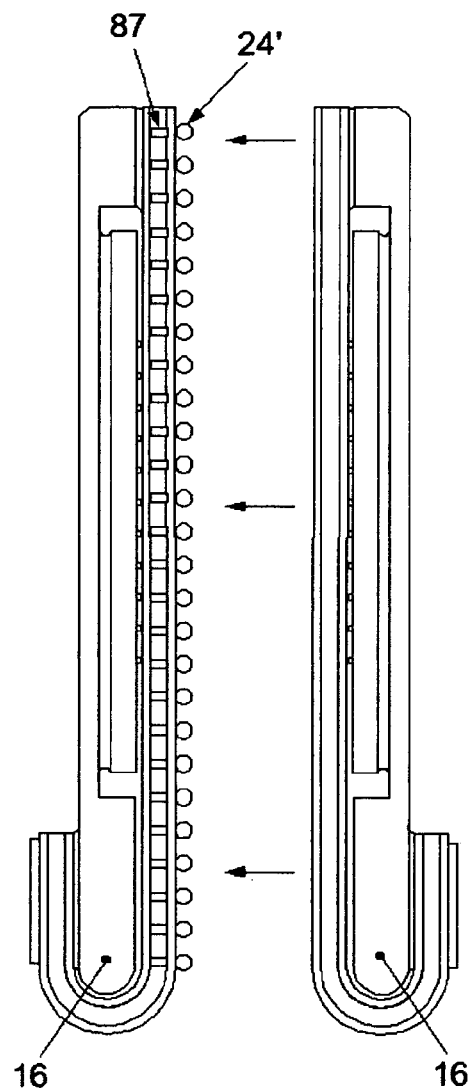

When chips 22 are placed in a mirror image configuration of a central flexible circuit, the stiffener on both sides of the flex is designed with a recessed cavity to host one or more chips (see FIG. 6A). The overall thickness is preferably maintained to be compatible with a standard connector 50. An added benefit in this example is that the flexible circuit is repositioned at the centerline of the sandwiched structure, which provides better symmetry and an opportunity to create a metal enclosure around the various components mounted to both sides of the central multilayered flex circuit 11. As shown in FIG. 6A, a discontinuous adhesive layer 2 may be used to join two subassemblies into a complete module. Alternatively, the two subassemblies may be joined at a plurality of discrete points as shown in FIG. 6B. These discrete points may comprise bump contacts 24' or pads electrically and mechanically joined with solder connections 95 or may be isotropic or anisotropic conductive adhesive 99, etc. It will be appreciated that these points may coincide with conductive vias (not shown) in the flex circuits, whereby signals from one subassembly may be communicated to the other subassembly. The resulting architecture is analogous to that shown in a slightly different form in FIG. 44.

Electrical ground pins, disposed among the array of external contact pads 18 of the outer copper patterns 7, can bring grounded connections through plated via holes (not shown) to the interior copper patterns 9. Then, when an electrically conductive adhesive is used as the bonding material 14' for attaching the bifurcated plies 4 to metal stiffeners 16, the metal stiffeners can function as a reference ground plane that provides protection for interior mounted IC devices from Electro-Static Discharge (ESD) and Electro-Magnetic Interference (EMI).

The metal stiffeners also provide a rigid shell for mechanical protection of fragile bare-IC die 22' or stacked die 22" disposed on the surfaces of the flexible circuit and a heat spreading surface to conduct heat away from the enclosed IC devices. The metal shell is preferably fashioned to maintain compatibility with standard connectors 50. The dimensions and mechanical sturdiness required for proper operation is designed into the shell.

FIG. 6A illustrates an example of very thin memory module 40 constructed in a manner consistent with that described for FIG. 4. In this illustration memory chips 22, stacked die 22' or bare die 22" are flip chip bonded to both surfaces of a central, multilayer, bifurcated flexible circuit 11 using an array of bump contacts 24. The bump contacts may comprise solder balls 93 or Ni—Au plated bumps in combination with isotropic conductive adhesive (e.g. silver-filled conductive epoxy) or anisotropic conductive adhesive. Other materials well known in the art of flip chip assembly may also be used. The stiffeners 16 extend in length above the height of the contained memory IC chips 22 and form a seal across the top with an adhesive bond 14 to the flexible circuit. The adhesive near the top of the module 40 may be a different material than that chosen for the attachment of the bifurcated plies of the flexible circuit. For example, the top adhesive can be a Pressure Sensitive Adhesive (PSA) chosen to enable the module to be pried apart for possible access to the contained memory components in order to remove and replace failed devices, while the bottom adhesive can be an electrically conductive adhesive 14' to provide a grounding function as previous described. Alternatively, the top portion of the stiffeners can include an integral mechanical snap for locking the stiffeners together (not shown) or use one or more clips (not shown) to pinch them together. Since the bifurcated flex circuit plies are adhesively bonded along the outer length of the module to the bottom edge, they provide a seal and flexible hinge at this location, enabling the stiffeners to be folded out and downward to allow access to the internal components.

Additional Symmetry & Grounding Solutions

Figure 7:
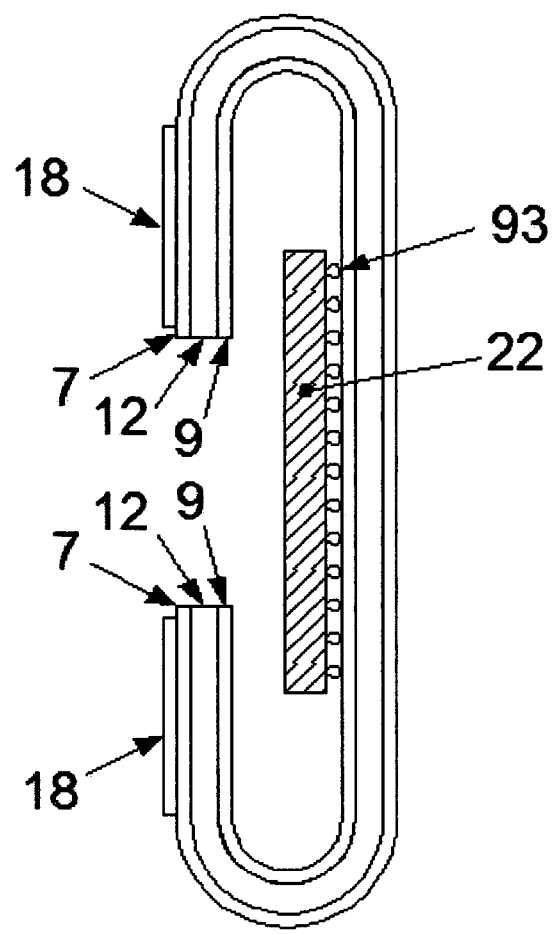
FIGS. 7-10 illustrate schematically in cross section some other ways of constructing the flex module of the present invention.

When a chip is mounted on a flex circuit, another way to achieve symmetry is to have a flex bend on the same side of the chip in two opposite directions as shown in FIG. 7. In addition to signal symmetry, the ground layer and signal layers can be designed to enable various useful functions. At high frequencies it is helpful to have the chip designed with large ground planes. This can be achieved by extending the flex interior ground plane layer 9 and wrapping it around the chip. The chip under that ground plane layer is fully enclosed and therefore has significant EMI shielding built into it, FIG. 8.

Figure 8:
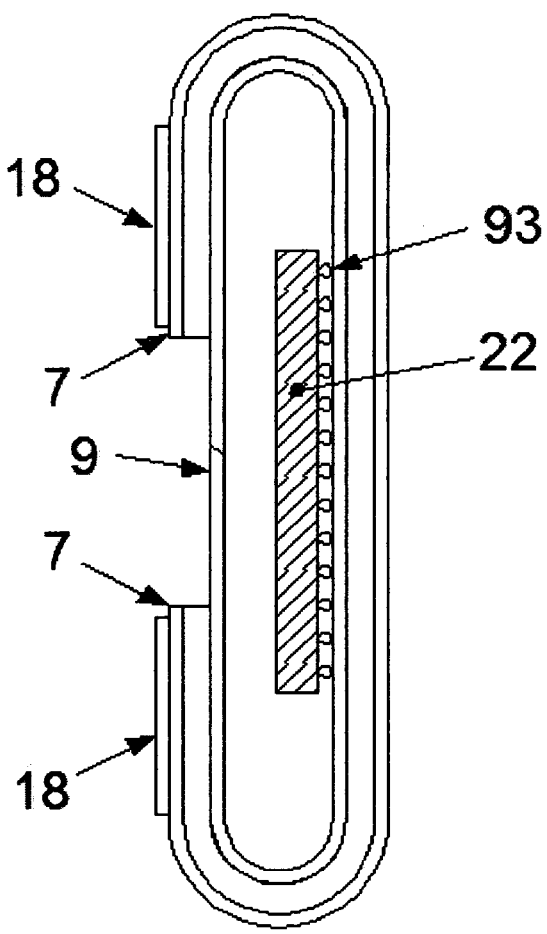
Figure 9:
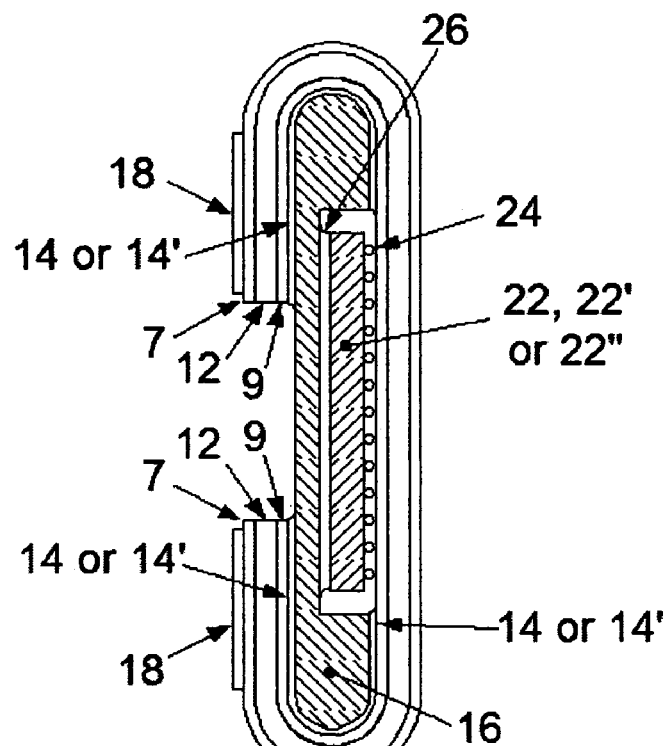

Since the assembly shown schematically in FIG. 8 has no structural rigidity, a stiffener 16 can be used to provide the chip(s) 22, 22' or 22" with backing support for handling and or insertion, as shown schematically in FIG. 9. Since the stiffener can be made of metal, a grounding method is thereby formed; the electrical continuity is maintained with the grounding plane of the stiffener. The stiffener in this case provides several functions including: mechanical protection, handling form factor, grounding plane, and thermal dissipation (heat sink).

Figure 10:
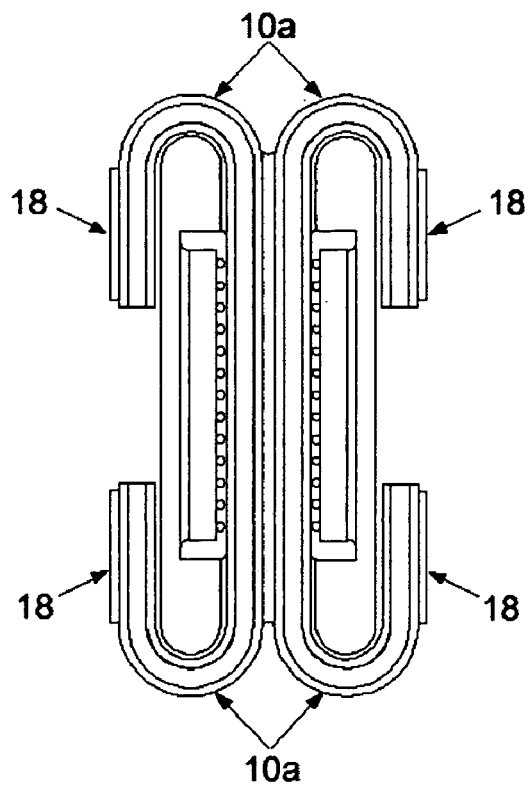

FIGS. 7-10 illustrate another sequence for building the inventive module. A double density, as shown in FIG. 10, is achieved when a mirror image structure is mounted on the back of the assembly shown in FIG. 9. The bifurcated flex is now disposed on both ends of the modular assembly as shown in FIG. 10. It will be appreciated that the resulting structure built up as shown in FIGS. 7-10 is similar to the structure built up as shown generally in FIGS. 2 and 4-6. Thus, the steps required to build the inventive module may be carried out in several different sequences.

When multiple chips are used, a multi-chip module (MCM) is formed using flex bifurcation on the bottom of the module or alternatively at the bottom and the top of the module, 10a, FIG. 12. As shown at FIG. 10, when the metallic heat sinks are assembled together, a cavity is formed in which all the chips are able to reside. This provides a large advantage in that package-less chips can be used which saves cost across multiple chips. The cost saving per chip will be multiplied by the number of chip placements in the module.

The connector pads 18' can be located on the tip of the flex arch, FIG. 12. This enables the direct connection between the module and the mother board.

Since the above-described modules have connections from the top as well as from the bottom, they offer the possibility of module stacking. It will be appreciated that the electrical connection can be fashioned in different ways while remaining within the spirit of the present invention.

Figure 13:
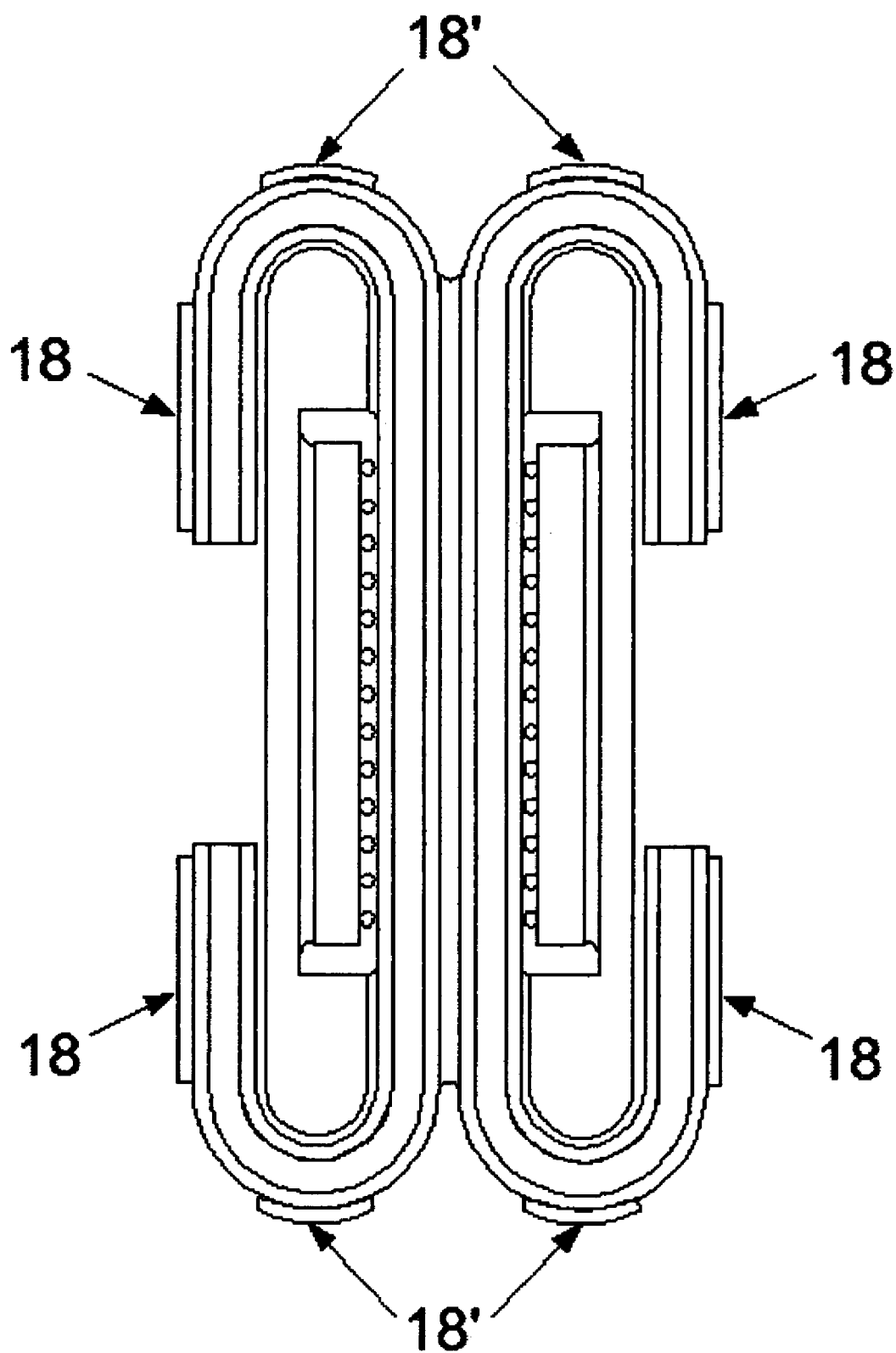
FIG. 13 illustrates schematically in cross section a module with electrodes disposed on two opposite edges in accordance with one aspect of the invention.
Figure 14:
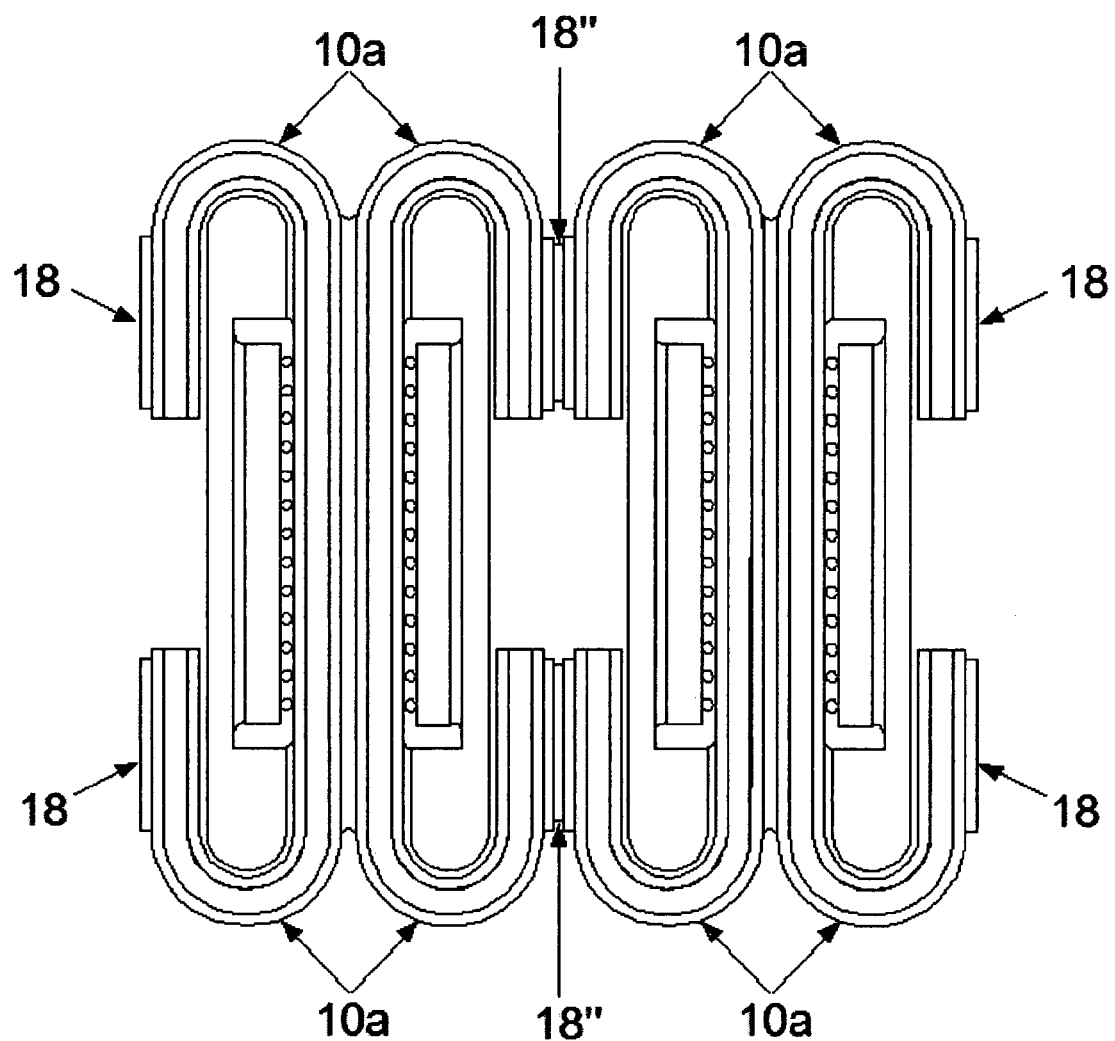
FIGS. 14-15 illustrate schematically some alternative ways of joining several flex modules together to expand functionality or memory capacity in accordance with one aspect of the invention.
Figure 15A:
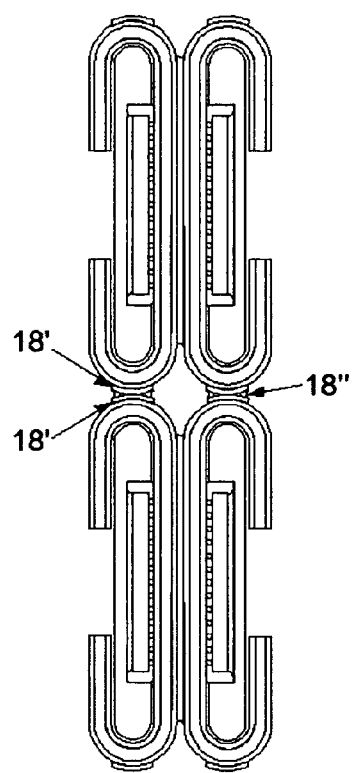
Figure 15B:
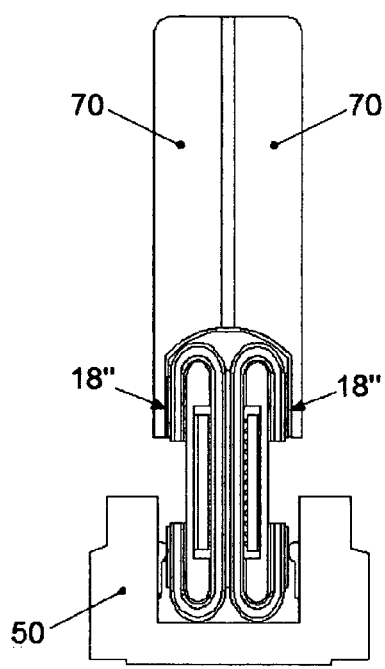
Figure 15C:
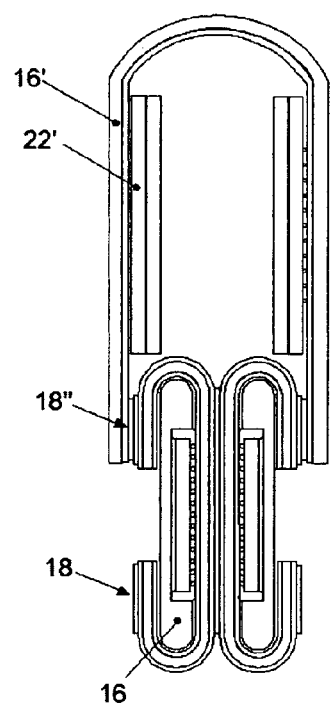

Lateral stacking and vertical stacking are both made possible by the present invention. FIGS. 13 and 14 illustrate various stacking methods. FIG. 13 illustrates how two modules similar to FIG. 10 can be stacked laterally or side-by-side by electrically joining the inter-modular connection pads 18". FIGS. 15A-C further illustrate several different vertical stacking configurations. FIG. 15A is similar to the module of FIG. 12 and shows contacts 18' at the tips of the bends of the flex electrically connected between the top and bottom stacked modules. The bottom module of FIG. 14b is generally similar to the module in FIG. 10 and shows a male/female stacking configuration in which the top male edge card contact pads 18 on the double bifurcated center flex 10a of the bottom module are inserted into a upper female receptacle with a bifurcated center flex with edge card contact pads 18 on an interior cavity formed in the base. As seen in FIG. 15C, the top module may be wider than the bottom module. In this case, while the bottom module, similar to FIG. 10, is cooled from the external surfaces, the top module, with a generally U-shaped stiffener 16', by virtue of its open configuration can be cooled from the inside through the cold air circulation.

In yet another embodiment of this invention, the stiffeners may comprise metal heat dissipating plates 16 that are surrounded and bonded to a frame consisting of injection molded plastic 70, FIGS. 16A, 16B, 24-28, 30-32, 35-38. The plastic frame 70 can include small locating pins or posts 81 in one side of the module and mating sockets in the other side of the module to engage with alignment holes in the flexible circuit. This would enable the flexible circuit pads 18 to be accurately positioned and referenced with respect to other molded-in keying or orientation features on the frames. Molded features within the plastic frame would also enable the module to engage with clasps or locking mechanisms or extraction mechanisms design as parts of the module's mating socket (not shown).

Figure 16A:
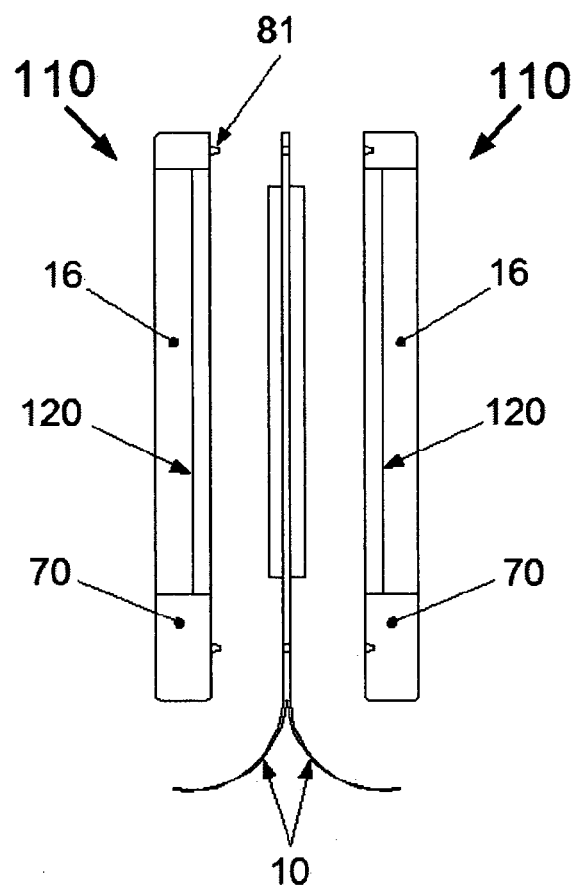
FIG. 16 illustrates schematically an arrangement in which a bifurcated flex is disposed within a protective frame that has spacers to protect the semiconductor devices from crushing in accordance with one aspect of the invention.
Figure 16B:
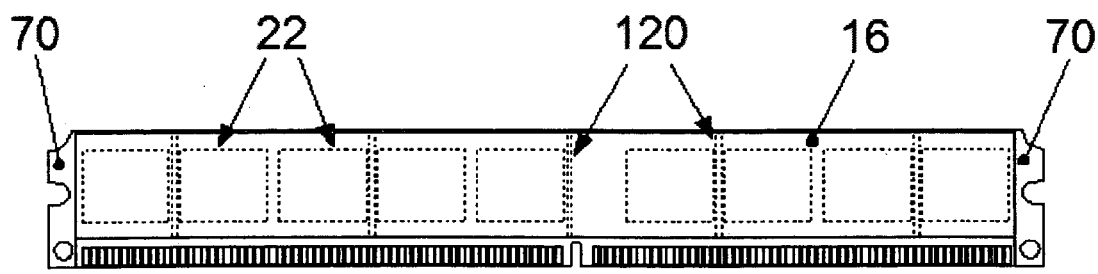

As shown FIGS. 16A and 16B, multiple thin spacers 120 (ribs or posts) are fashioned on the metal or composite heat spreaders 16 and positioned between groups of semiconductor chips or individual chips to prevent potential damage of the chips should an external pressure or force be applied against the outer surfaces of the two halves of the clam shells 16, pushing the chips toward each other.

Multi-Density Connections

Figure 19:
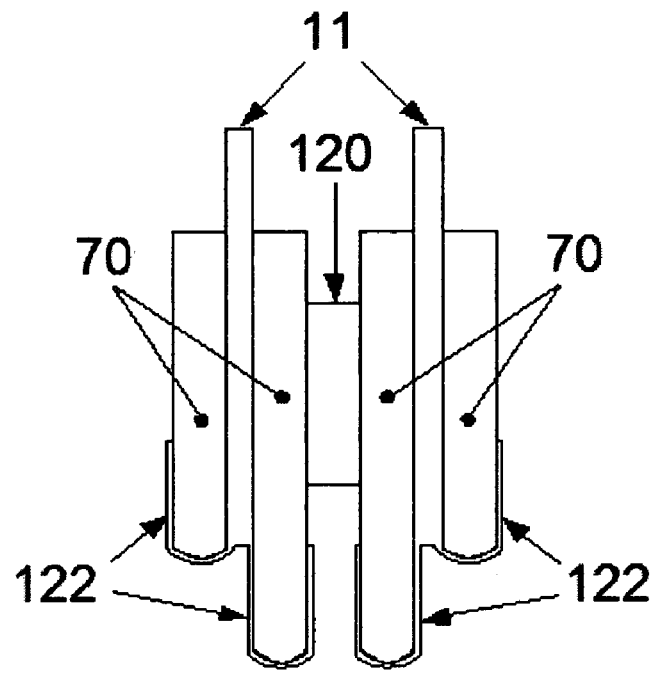
Figure 20:
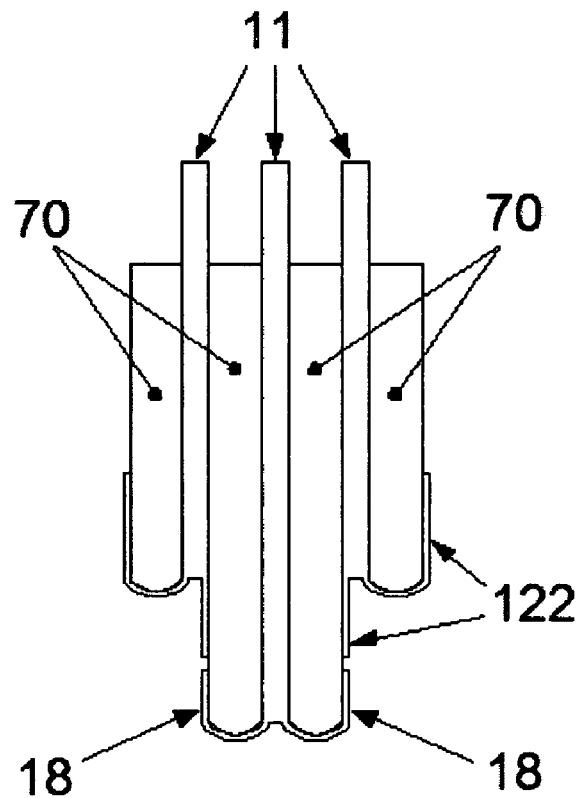
Figure 21:
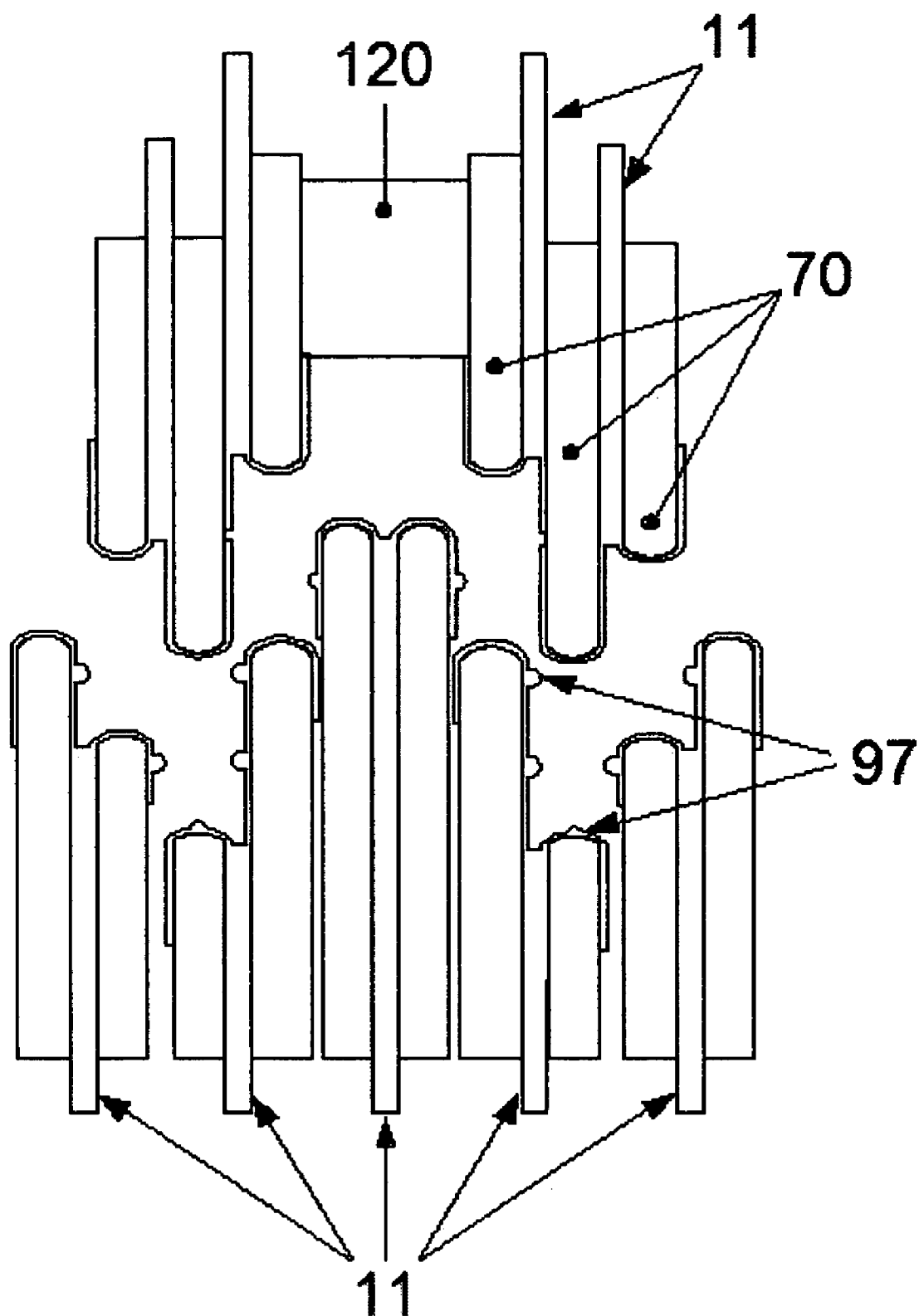
FIGS. 21-22 illustrate schematically an arrangement in which modules have more than one bifurcated flex arranged to engage a second module or a corresponding socket in accordance with one aspect of the invention.
Figure 22:
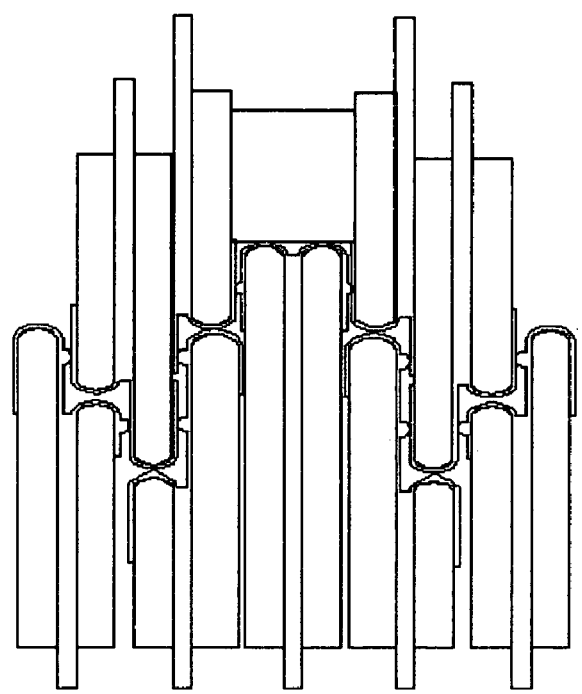

The minimal thickness module design using bifurcated flex as described herein can be implemented in various configurations. As can be seen from FIG. 18 the bifurcation of flex 11 can be done for modules that are staggered in the z (height) axis to produce a multi-points connection. These staggered bifurcated 122 modules can be configured in mirror image for increased density as shown in FIG. 19. The same concept can be used for three or more modules connection as suitable for higher densities. A three-module connection is shown in FIG. 20. A multi point and high density connection can be implemented using a special mating connector as shown schematically in FIG. 21 (about to engage) and FIG. 22 (fully engaged).

Figure 23:
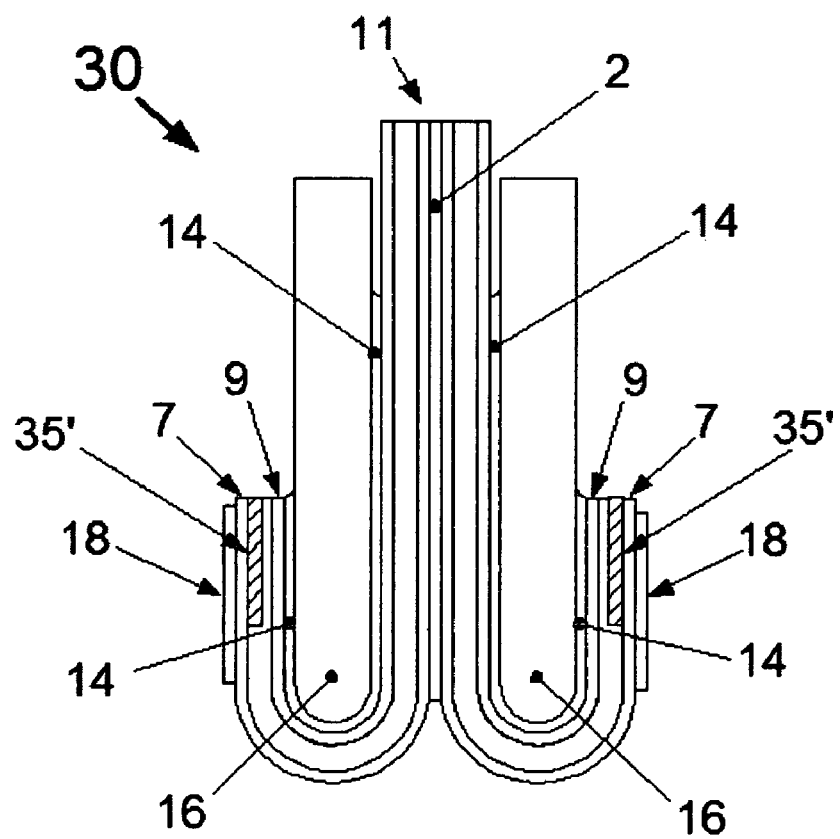
FIG. 23 illustrates schematically one way in which embedded passives may be incorporated into the invention.

Another significant benefit of the inventive bifurcated flex design is the ability to add passives 35' in the fold of the plies to achieve capacitive and resistive functions in addition to the ground connection enabled by contacting the metal clam shell as illustrated in the cross-section view FIG. 23. The passive devices may include chip resistors, chip capacitors, thin- or thick-film resistors or capacitors, inductors, thermistors, and varistors. Skilled artisans will appreciate, therefore, that bifurcation of the flex as taught herein allows additional design elements that are otherwise not easy to integrate.

Once the embedded passives 35' as well as the metallized layers are bonded to the metal enclosure, a laser trimming and splitting operation may be used to split and create the various lateral connection pads. When separated by splitting (not shown), the contact pads are able to independently operate in achieving and maintaining compliant contact with the mating contacts on either a socket or adjacent module. Alternatively, the contact pads may conform over shaped spring contacts (not shown) beneath that are operable by electrical/mechanical forces (e.g. piezo-electrical or mechanical effect) or simple bumped structures as previously described.

Description of the Exterior Shell

A thermally conductive outer or exterior shell 16, or U-shaped stiffener 16', serves several purposes. It mechanically encloses and protects the devices within an interior cavity to prevent direct contact with the fragile chips during handling. It also provides an electrostatic and electromagnetic shield when properly grounded to prevent possible damage to the contained ICs from electrostatic discharge and/or prevents potential electromagnetic interference with other closely spaced adjacent components. When properly connected in thermal communication with the enclosed devices the outer shell also provides a means for conducting heat from the operating chips to the external surfaces of the outer shell where the heat can be transferred by either static or forced convection air flow. Alternatively, the exterior shell can form a liquid and/or gas tight enclosure through which a circulating fluid or gas can be introduced and removed to provide direct cooling of the devices within the module's cavity.

The exterior shell preferably comprises a thin metal such as aluminum or copper, or metal alloy such as steel or Kovar that is either machined or stamp formed. Many ceramic materials can also be substituted, provided they have sufficient strength and thermal conductivity. Metal can be easily stamped, pressed or cast into a variety of shapes to improve rigidity, resistance to bend or twist, and thermal dissipation. In addition, metal fittings or ports can be fashioned or added to the exterior shell to enable the introduction and removal of circulating liquids or gases within an interior cavity of the module.

When adapted for memory module applications, the exterior shell would preferably have a generally rectilinear shape. If prepackaged memory components (e.g. FBGA, μBGA, CSP, etc.) are used, the combined thickness of these components, when mounted on both front and backside surfaces of a central flex circuit or thin PWB, can exceed the JEDEC (Joint Electronic Device Engineering Council) specification for the module substrate thickness (1.27±0.10 mm) as measured across the width of the edge finger contacts (pad-to-pad thickness). In this instance the exterior shell can have flanges surrounding a pocket shaped area that bulges out slightly to allow for the protruding DRAM packages, FIGS. 12B-E, 16A-B, 47A-B, 49, 52. If, on the other hand, bare silicon memory chips are mounted onto the central flex circuit or thin PWB, their combined thickness would be less than the specified module thickness and the exterior shell can essentially consist of a flat metal or ceramic plate.

The exterior shell is intended to be an integral part of the module as distinguished from the current practice of adding separate metal heat spreaders on top of traditional surface mounted DRAM components and using metal clips to hold them in place. This current practice adds to the overall mass and thickness of the module ($\geqq 6.5$ mm) which impedes the flow or circulation of cooling air between adjacent modules that are closely spaced together. Using an integral heat spreading exterior shell in combination with a thin substrate enables the module thickness to be significantly reduced ($\leqq 3.5$ mm) and helps achieve a minimum mass. Since no components are exposed on the exterior surfaces, the module's robustness is greatly improved, potentially enabling robotic insertion of the modules into their respective DIMM sockets.

In many applications of the invention, it is contemplated that two separate exterior shells 16 or metal frames 82 are bonded to both sides of a laminated PWB frame 73 or rigid-flex substrate 90 and function as stiffeners to support the thin flex circuit and form a major portion of both front and backside surfaces of the module. However, in another embodiment of this invention, the exterior shells form almost the entire outer surfaces of the module and in particular the bottom edge portion of the module, FIGS. 11, 12A-E, and 57. A center flex circuit, containing a bifurcated bottom section, extends beyond the bottom edges of the exterior shells. This bifurcated portion of the flex circuit is then wrapped around the bottom edges of the two metal shells, which are symmetrically joined together, FIG. 12C, to form the contact pads for applying electrical signals and power and ground connections to and from the socket. These contact pads 18 would consist of etched metal (e.g. copper) or sputter deposited traces (e.g. tungsten-copper) that are coated with a sequence of tarnish and scratch resistant plated metals (e.g. nickel and gold) intended for mating with the pins of existing DIMM type sockets. Alternatively, the extreme bottom edges of the folded flex circuit sections can incorporate electro-plated coppernickel-gold bumps or other electrically conductive bump material (e.g. silver-filled conductive epoxy bumps) intended for direct compression mating with electrical pads or annular openings in the motherboard, thus eliminating the need for sockets with electrical pins, FIGS. 13, 4345, 53-54. In this embodiment an elastomeric material 96 such as a silicone rubber strip may be advantageously included on the backside surface of the flex circuit opposite the electro-plated bumps in order to enable better compliant mechanical contact between the electrically conductive bumps on the flex and mother board contacts, FIG. 44.

Figure 47A:
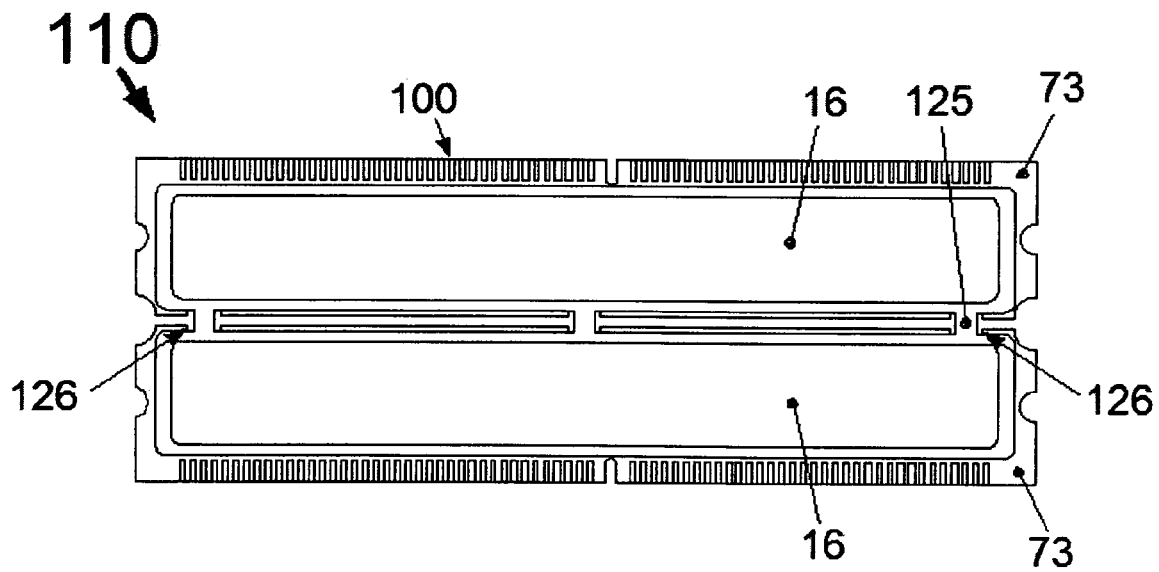
FIG. 47 illustrates schematically a multichip module in which the frame and covers form a clamshell arrangement according to another aspect of the invention.
Figure 47B:
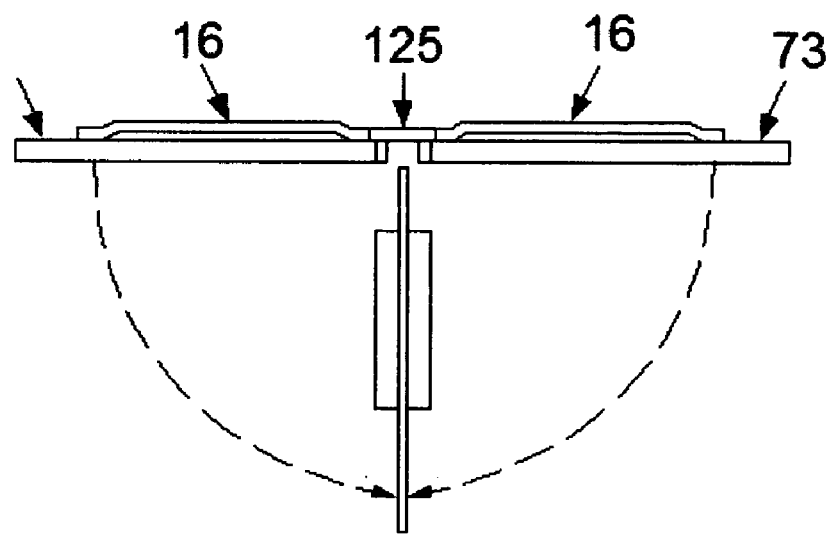
Figure 48:
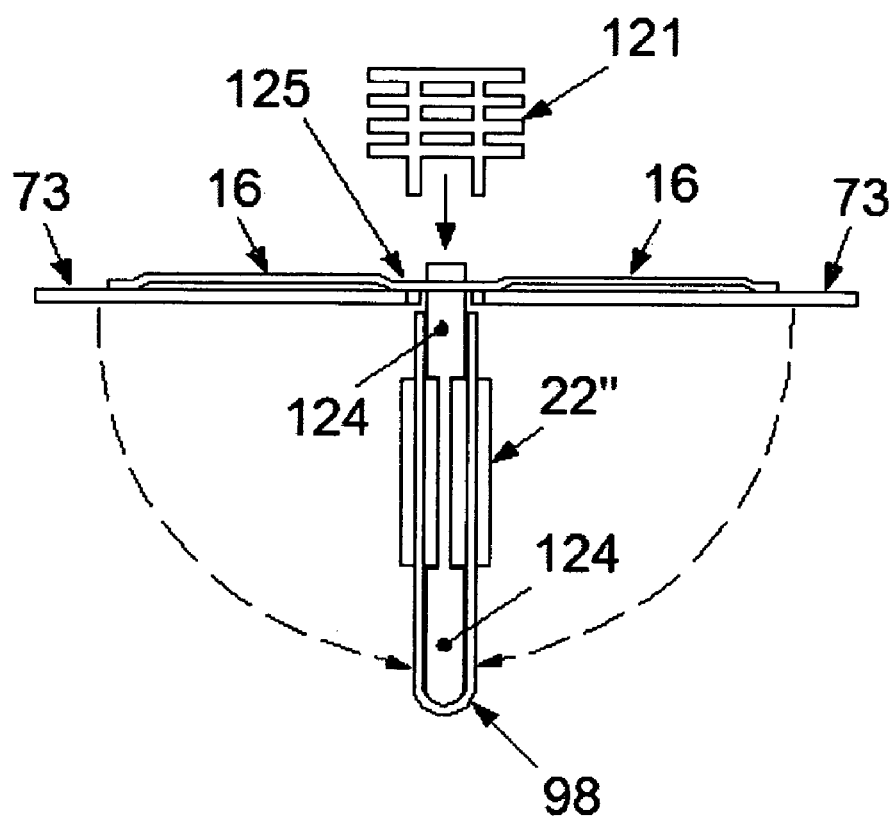
FIG. 48 illustrates schematically a multichip module having a central heat pipe, a clamshell type cover, and an external heat exchanger according to another aspect of the invention.

In another embodiment of this invention the two separate exterior shells 16 can be joined with metal tabs 125 across the top edges of the module in a manner that enables the two shells to be folded about a center axis between the two halves, FIGS. 47B and 48. In this manner the exterior shells are pre-joined along one of their respective edges and can be folded together like a clam shell with the tabs acting as a hinge. The center flex circuit or thin PWB would be sandwiched within the center of the folded exterior shells and properly oriented by means of small posts incorporated within the interior edges or ends of the shells that engage with similar sized and oriented holes in the flex circuit or thin PWB. In this manner the module can be subsequently unfolded and reopened for repair if necessary.

In a similar manner, represented in another embodiment, FIG. 48, a single flexible circuit can be wrapped from the top of one side, down and around the bottom of an "internal" heat spreader or cooling core or chamber 124, and back up the opposite surface and to the top edge on the side opposite from the previous side. The chips may then be mounted on both sides of the flexible circuit and protected by a foldable metal enclosure as discussed above.

Description of Supporting Hollow Frames

In some embodiments, FIGS. 16-22, 2449, 50-55, the module can also include supporting hollow molded plastic frames 70 or PWB frames 73 that sandwich both sides of the central flex circuit or thin PWB. These hollow frames may be adhesively attached to both sides of a flexible circuit or thin PWB, which preferably occupies a center plane of the assembly and on which the components are mounted. The hollow frames also act as front and backside spacers that create a nested cavity for these components. They also provide a mounting surface for the flanges of the two separate exterior metal shells 16, FIGS. 16, 2428, 30-49, and 52, which when attached completely enclose the cavities formed by the hollow frames.

In one embodiment these supporting frame members 70 comprise two thin mirror-imaged PWB boards that include standard etched-copper metal pads with Ni—Au plated surfaces arrayed along the bottom exterior edges and intended to mate with current DIMM sockets, FIGS. 25, 29, 32-34, 38-48, 50, 52-55. The combined thicknesses of the center flex circuit or thin PWB, the adhesive used for bonding the supporting frame members, and both halves of the frame members themselves, could be constructed to conform to the current JEDEC specification for the substrate thickness of the edge finger contacts (1.27±0.10 mm). The etched-copper pads can be electrically joined to traces or pads on the flex circuit or thin PWB in a number of different ways, as illustrated in FIGS. 23-45.

In another embodiment the hollow frames 70 consist of plastic molded pieces that can incorporate a variety of different external and/or internal electrical contacts as shown generally in FIGS. 24, 26-28. The contacts are formed onto the molded plastic as either thin metal pads that are embossed or thermal stamped onto the surface or emplaced as wrap-around metal edge clips, and can include drilled and plated via holes or formed with molded slots for metal inserts or holes for metal pins.

According to yet another embodiment the hollow frames 70 may comprise plastic molded pieces without any external contact pads, as illustrated generally in FIGS. 15B and 16-22. In this instance the frames 70 can be mated with a bifurcated center flex circuit having contact pads 11 that extend beyond the bottom edges of the molded frames, as illustrated in FIG. 16A, and which are wrapped in opposite directions around the bottom edges of the two frames 70 in a manner as previously described.

The exterior shells 16 can be attached to the hollow frames 70 by several means. In one instance a pressure sensitive adhesive (PSA) perform is pre-applied to either the flanged edges of the exterior shells or the edges of the hollow frames before the pieces are bonded together. Alternatively, the adhesive may be screen printed onto either surface. Alternatively the interior mating surfaces of both flange areas can consist of a metal or metal alloy over the plastic that would enable the parts to be bonded with a fusible solder perform or laser welding or ultra sonic welding. The attachment of the exterior shells to the hollow frames can be performed either before the hollow frames are bonded to the center flex circuit or thin PWB or after.

Description of the Interior Interconnecting Substrate

The interconnecting substrate preferably comprises a thin multilayer flexible circuit or thin multilayer rigid printed wiring board (PWB) that is approximately 0.008" (200 µm) thick. The interconnect substrate would preferably occupy a center plane within a symmetrically shaped module such that individual integrated devices 22, 22', 22" and passive components 35 are mounted on both front and backside surfaces of the substrate and, if needed, electrically connected across the thickness of the substrate. The interconnecting substrate can also incorporate passive components that are integrated 35' within or on the surface of the substrate itself consisting of thin or thick film resistors or thin metal capacitive plates layered above each other and separated with dielectric films. Integral passive components of this type are well known within the industry.

The interconnecting substrate material may consist of polyimide, liquid crystal polymer (LCP), polyester film and many other materials well-known within the industry. In some applications for the inventions described herein, the flex material may exhibit opto-electric properties that enable optical signals to be transmitted between the integrated devices mounted within the module. The flex circuit material may either be optically transparent to the optical signals, modified with punched or etched holes to allow optical signals to be transmitted through the thickness of the flex material, or contain special coatings with refractive properties suitable for fashioning waveguides across the surface of the flex circuit.

Description of the Integrated Circuit Devices

The Integrated Circuit (IC) devices 22, 22', 22" contained within the interior portion of the module can include DRAM, SRAM, PSRAM, Flash, MRAM, and other newer memory type devices currently under development, or logic devices such as Registers, Advanced Memory Buffer (AMB), Phase Locked Loop (PLL), Serial Presence Detect (SPD) and other similar devices intended to function as driver, buffer, control and interface devices. In addition microprocessor devices can be incorporated within the module and inter-connected with memory chips placed in adjacent locations. In the future IC devices with optical emitters and detectors for signal propagation can be employed. It is also contemplated that passive or active RF devices may be included, as well as LCD and other optoelectronic components, making the invention suitable for use in cellular phones, GPS devices, and RFID systems, among others. It will be appreciated that the aforementioned RF devices may have integral antenna structures or the antenna may be a separate component or it may be constructed as part of one of the metallization patterns on the substrate material.

The aforementioned IC devices are preferably attached to the Interconnecting Substrate using flip chip or direct chip attach (DCA) technology. In this manner the IC devices occupy the smallest footprint area on the substrate and are oriented with the active surface of the ICs towards the substrate. The IC devices can occupy either the front and/or backside surfaces of the interconnecting substrate. Alternatively, the IC devices can be individually packaged in molded plastic and attached to the substrate with solder using surface mount technology (SMT).

Description of the Exterior Contact Pads and Means of Connection with the Interior Interconnecting Substrate In some embodiments, FIGS. 32-34, 38-48, 50, 52-55, of the present invention the interconnecting substrate is sandwiched between two thin and hollow PWB frames 73. These frames may have conventional copper clad contact pads that conform to JEDEC industry standards for DIMM modules. The combined thicknesses of the interconnecting substrate, sandwiched and bonded between two hollow PWB frames, the adhesive materials used, and the copper clad pads, may be adjusted to equal the proper pad-to-pad thickness (1.27 mm) across the bottom edge of the module for proper mating with existing DIMM sockets. The PWB contact pads may be electrically connected to the interior substrate in a manner typically used in the construction of "rigid-flex" circuit cards or by a variety of methods familiar to those skilled in the art.

Figure 44A:
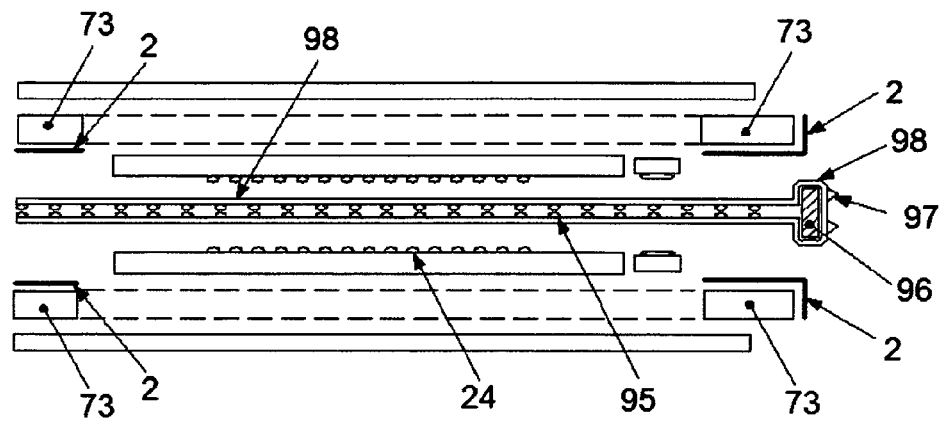
FIG. 44 illustrates schematically a multichip module constructed using folded flex compatible with reel-to-reel processing according to one aspect of the invention.
Figure 44B:
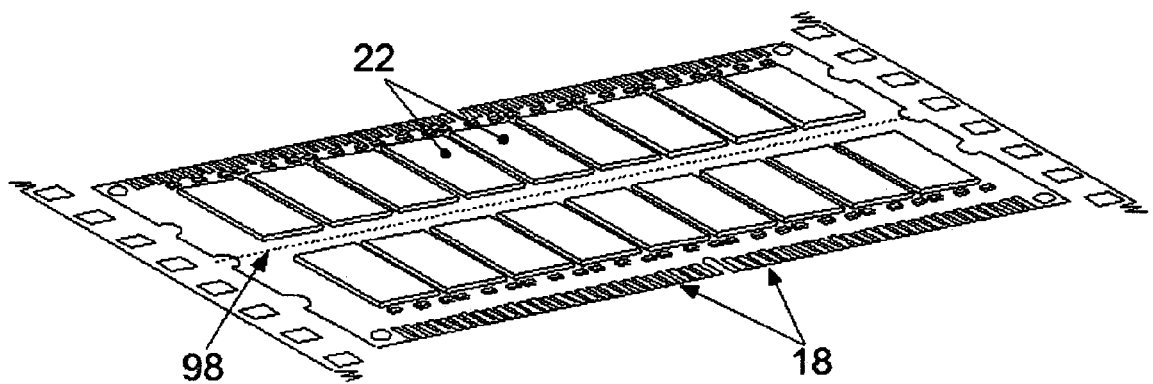
Figure 44C:
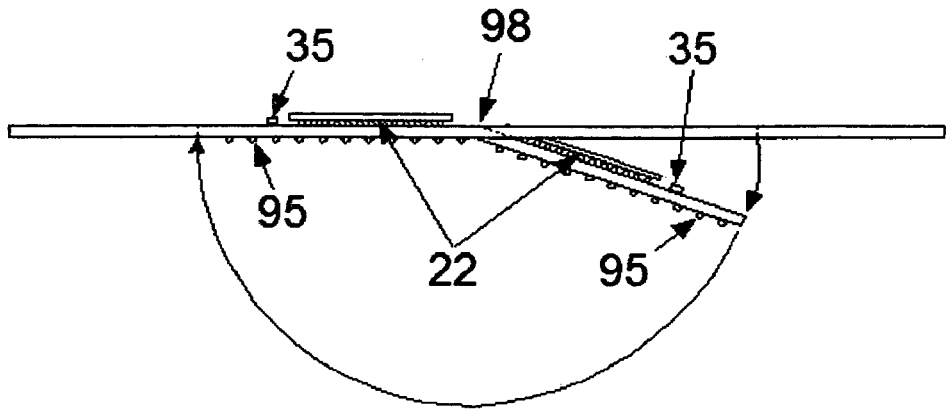
Figure 44D:
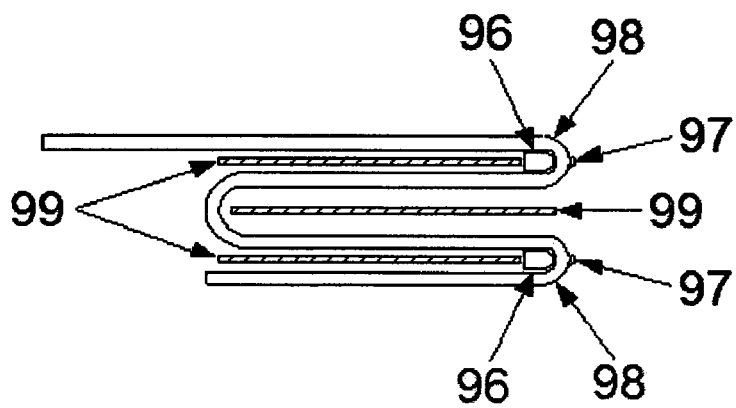
Figure 45:
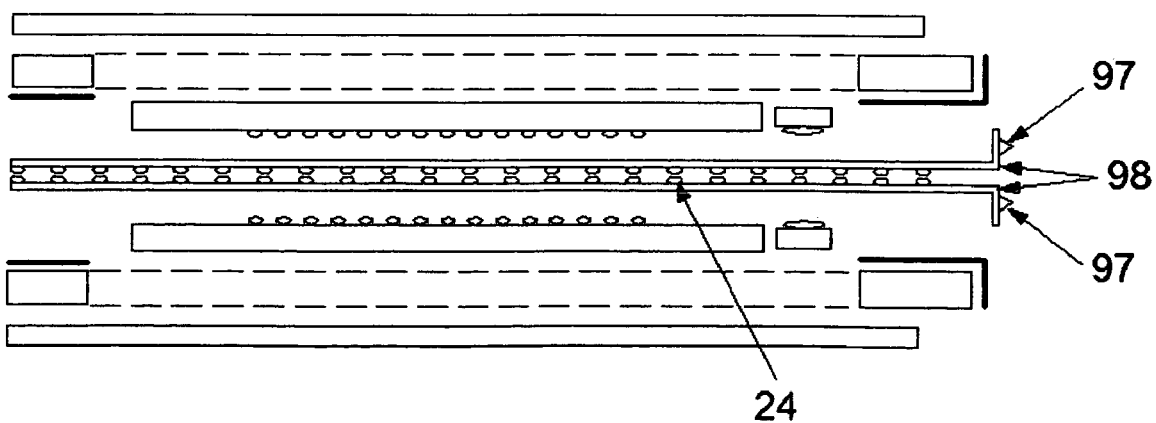
FIGS. 45-46 illustrate schematically two multichip modules according to the invention.

Contact pads for the module may also be incorporated within extended portions of a flexible interconnecting substrate that is bifurcated and wrapped around the bottom edges of formed portions of the exterior metal shells, FIGS. 12B-E, or the bottom edges of hollow PWB frames that contain no copper clad pads, FIGS. 44, 45. These pads are also preferably designed to conform to existing JEDEC standards for DIMM memory module sockets but can also be resized and relocated to the extreme bottom edge of the module in order to enable the modules to mate with new sockets specifically designed for extreme low profile mounting and/or zero insertion force (ZIF) mating, FIGS. 13, 15A, 24, 44, and 45. By placing the contacts at the extreme bottom edge, the module can be electrically connected directly to the motherboard circuit without the necessity of using intervening socket pins. This enables the module to be mated to the motherboard with minimum profile height, electrical discontinuity and insertion force. A variety of bottom edge interface contacts are described elsewhere in this application for this purpose.

In an alternative embodiment, the contact pads formed on the flexible circuit are fashioned to enable inductive or capacitive coupling of digital signals from the socket or motherboard into the module. Electrodes for this purpose would be printed or etched into specific patterns and layers of the flex circuit to couple RF energy in the form of digital signals from the socket or motherboard to signal traces within the flex circuit.

Description of the Means for Thermal Communication between the Integrated Circuit Devices and Exterior Shell As noted earlier, a major goal of the present invention is to remove the heat generated by the contained IC devices as efficiently as possible. Therefore the module is designed to enable the shortest thermal path between the backside surfaces of the contained ICs to the heat spreading surfaces of the exterior shell, whereby heat is subsequently dissipated by conduction and/or convection to the surrounding exterior ambient air or cooling fluid. Since air is intrinsically a thermal insulator, it is desirable that the thermal path between the ICs and interior surfaces of the metal shell be filled with a thermal interface material 26 that exhibits properties of good thermal conductivity and elasticity for cushioning the fragile IC devices. Examples of materials suitable for this purpose would include silicone elastomer composites, either in the form of a paste or compliant rubber-like film that is preferably filled with silicon nitride, boron nitride, or other particulate filler with good thermal conductive properties (e.g. diamond, copper, carbon, etc.).

Description of Module Assembly Methods

A common design feature for the exemplary modules of the invention is a centrally placed thin multilayered PWB or flexible circuit. It is contemplated that this interior interconnecting substrate is typically pre-assembled with surface mounted ICs and passive devices prior to attachment of the hollow frames and/or exterior metal shells.

When hollow molded plastic frames 70, metal frames 82, or PWB frames 73 are employed the exterior metal shells 16 can either be pre-attached to the hollow frames as a subassembly or adhesively bonded in place after the hollow frames are separately laminated to the interconnecting substrate. Alternately, the metal exterior shells 16 can be added as a last step of the assembly by sliding them over the hollow frame, as shown in FIG. 12A, and adhesively bonding them in place or with edge clips located along the top edge of the module which apply a pinching force to hold the exterior shells in place (not shown). In a preferred configuration the exterior shells are first pre-bonded to the hollow frames such that both halves of the exterior shells are joined together at a centerline along the top edge of the module using stamped metal tabs 125, as illustrated schematically in FIG. 47. These metal tabs act as bendable hinges allowing the subassembly to be folded down and around the interconnecting substrate. The folded subassembly sections are then laminated to the edges and sides of the enclosed interconnecting substrate using either a pressure sensitive adhesive (PSA) or a thermoset adhesive such as epoxy. The final step of assembly for this configuration is the electrical and/or mechanical connection of the bottom edge finger contacts.

In one embodiment the interconnecting substrate is a flexible circuit that extends some distance beyond the lower edge of the hollowed frame. The extended flex circuit is bifurcated in a manner to enable two separate flex portions to be folded in opposite directions and bonded around the outer bottom edges of the hollow frame. In this example a PSA adhesive, thermoset adhesive such as epoxy, electrically conductive epoxy, or even solder (when joining metal to metal) may be used for this final step of the assembly. Contact pads intended for mating with a standard DIMM socket are exposed and arrayed along the outside surfaces of the folded flex circuit portions. The contact pads are in turn electrically connected through traces to the interior laminated layers of the interconnecting substrate.

In other embodiments the interconnecting substrate is either flush or extends only a short distance beyond the lower edges of the hollowed PWB frames containing DIMM-type copper clad contact pads. The extreme bottom edges of the hollowed frames contain an array of metallized castellations 123 (crescent shaped copper plated through holes) that electrically bridge across the thickness of the frames and enable the exterior PWB contact pads to be electrically connected with interior pads arrayed on the either side of the interconnecting substrate. The metallized castellations are electrically connected to the pads of the interconnecting substrate using either solder or electro-plated connections, FIGS. 41-45, 53-56.

In summary the assembly steps for non-bifurcated flex modules are as follows:
a. Assemble all IC and passive devices to a thin multilayer interconnecting substrate.
b. Form metal exterior shells configured as two symmetrical heat spreading surfaces that are joined together along their lengths with bendable metal tabs or as two individual pieces.
c. Form two symmetrical hollow frames.
d. Adhesively bond the stamped metal exterior shells to the two hollow frames forming either a unified subassembly or two separate subassemblies.
e. Adhesively bond the hollow frames to an interconnecting substrate.
f. Form electrical contact pads with the interconnecting substrate.

In another embodiment of the invention the hollow frames are eliminated and the metal exterior shells are adapted for mating with a thin, flexible, and bifurcated interconnecting substrate as previous discussed above. The bifurcated portions of the flexible interconnecting substrate are folded in opposite directions, as previously described, and bonded around the outer bottom edges of the metal exterior shell.

In summary the assembly steps for this alternative embodiment of bifurcated flex modules are as follows:
a. Assemble all IC and passive devices to a thin multilayer interconnecting substrate.
b. Form metal exterior shells configured as two symmetrical heat spreading surfaces that are joined together along their lengths with bendable metal tabs or as two individual pieces.
c. Adhesively bond the exterior shell(s) to the interconnecting substrate.
d. Form electrical contact pads with the interconnecting substrate.

Another embodiment, shown generally in FIG. 44, uses a single flexible circuit that is folded 98 upon itself and includes plated contact bumps 97 or pads located at the extreme bottom edge of the module. The flexible circuit remains centrally positioned within the thickness of the module, but is wrapped upon itself to form two separate circuits that are electrically connected together along the area of length and width of the folded portions 95. In essence the flexible circuit is a four-layer multilayer circuit created from a single sheet of double-sided flex material by means of folding the circuit in half and connecting pads or bumps 24 arrayed across the two inner surfaces together. The means for providing electrical interconnections between these inner layers is either solder, ACA, ICA, thermo-compression bonding and other techniques well known within the industry. Using a folded flex circuit enables the cost of the circuit to be kept to a minimum as well as enabling the emplacement of an elastomeric material 96 (e.g. silicon rubber) along the fold axis to fashion a compliant contact means on the opposite surfaces of the folded flex portion. Since the cost of the flexible circuit is a function of the number of layers within its cross-sectional thickness and since double-sided flexible circuits are currently used in high volume applications, the intent of this embodiment is to enable the manufacture of a four-layer multilayered flexible circuit from a single sheet of double-side flex circuit material. Alternatively, a four-layer flexible circuit, when folded in half and internally connected as described above, can be used to fashion an eight-layer flexible circuit.

The folding process, for forming a multilayered flex circuit from a single sheet of double-sided flex circuit, can be advantageously combined with component assembly through an SMT assembly line. When properly designed, the flex circuit can have all surface mounted components electrically/mechanically attached onto only the top surface of the double-sided flex circuit. Then using a cutting tool (e.g. laser or water-jet) one-half of the flex circuit can be cut around the circuit's perimeter to loosen it from the surrounding flex carrier. This free half can then be folded underneath itself (i.e the portion of the flex circuit that remains attached to the carrier film) such that half of the components are on opposite surfaces of the folded flex circuit. In this configuration, the folded flex circuit is sandwiched in the middle between surface mount components and is folded about a center axis parallel to the length of the circuit. The inner layers of the folded flex circuit would be aligned and selectively bonded together both electrically and mechanically to form the bifurcated or non-bifurcated flex circuits of the inventive module embodiments described herein. This unique assembly process flow would be extremely efficient using either inline, reel-to-reel, assembly equipment or carrier supported transfer of the flex through a conventional SMT assembly line. The typical need to flip the substrate over for a second double-sided pass through the assembly line would be eliminated by this assembly technique, saving time and increasing SMT throughput.

The inner layers associated with this folding process may consist of either conductor trace patterns similar to the outer layers on which the surface mounted components are attached, or may consist of power or ground planes separated with dielectric films that include selective conductor paths through the thickness, FIG. 44C.

An array of contact bumps 24 or plated bumps 97 or pads 100' along the bottom edge of the module enables the module to be connected to the motherboard without the necessity for using sockets with pin contacts. This contact means enables the module to be mounted in a vertical orientation with a minimum profile or height above the plane of the motherboard and allows the module to make direct electrical interface with the motherboard, thereby reducing electrical parasitics. Alternatively, the flexible circuit can include standard DIMM contacts 100 arrayed along the bottom external edges of the PCB window-frames 73 and include additional means for connecting contacts of the folded flexible circuit similar to those discussed in the previous Figures. This would thereby enable the module to be interchangeable adapted for either direct connection to the motherboard or into a standard DIMM type socket. The bumps arrayed along the bottom edge of the folded flex circuit may be fashioned as previously described elsewhere.

A summary of the assembly steps for an alternative embodiment of a bifurcated flex module fashioned by folding a double-sided flex circuit into a multilayered circuit is as follows:
a. Fashion a double-sided flex circuit with selective contact points on one surface and on opposite sides of a folding axis.
b. Assemble all IC and passive devices to the surface opposite the contact points.
c. Fold the flexible circuit along the fold axis such that the selective contact points are aligned across from one another on opposite sides of the folding axis.
d. Form electrical connections between the selective contact points that are aligned.

e. Form metal exterior shells configured as two symmetrical heat spreading surfaces that are joined together along their lengths with bendable metal tabs or as two individual pieces.
f. Adhesively bond the exterior metal shells to the interconnecting substrate.
g. Form electrical contact pads with the interconnecting substrate.

Provisions for Repairs

In each of the examples noted above the metal exterior shell can be affixed to the hollow frame or interconnecting substrate using a PSA type adhesive. Therefore this portion of the assembly is able to be removed, if necessary, to enable access to the IC devices contained within the protected cavity for removal and replacement.

Figure 52:
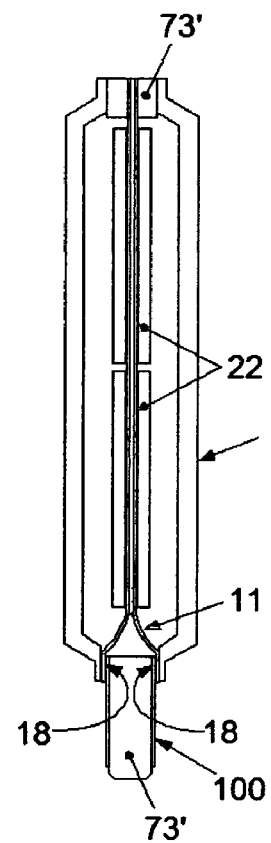

FIGS. 24 through 48 illustrate various methods by which the mating of thin laminate PCB or a flex circuit can be made with 2 PCB frames 73. An additional heat sink cap or U-shaped stiffener 16' may be added as a clip from the top as shown in FIGS. 12A and 48. The heat sink 16 or 16' in this case is made from one foldable piece of metal. Another way to assemble a thin module using one FR4 frame rather two consists of using a single frame and bifurcating the flex to yield a module described in FIG. 49. Yet another way to maintain symmetry is to use a slit FR4 from the top and one-piece at the bottom. This is represented in FIG. 52. The frame material can made of other material compatible or superior to the properties of FR4.

In all of the illustrations, it is important to note that the module architectures are compatible with monolithic chips 22" as well as stacked chips 22'. Also all of the illustrated architectures are compatible with a double row of chips as illustrated in FIGS. 49-52.

Figure 56A:
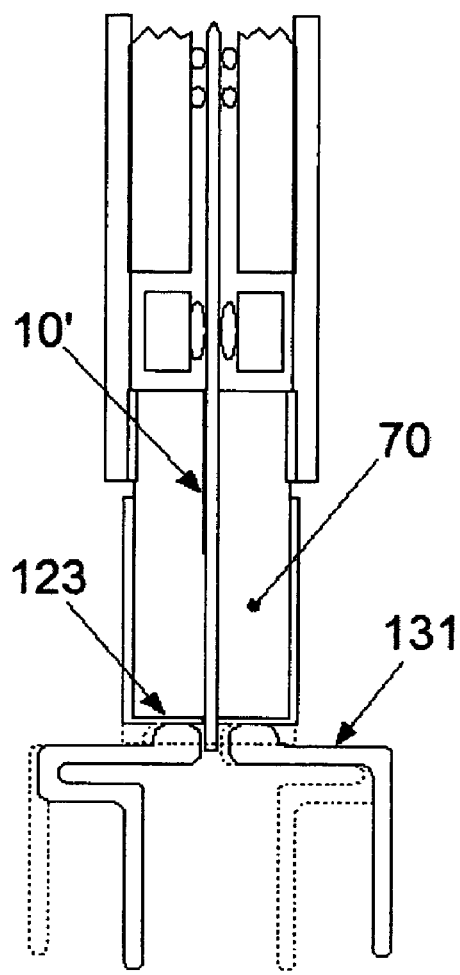
FIG. 56 illustrates schematically a low-profile pin contact arrangement suitable for use with castellated contact pads according to another aspect of the invention.
Figure 56B:
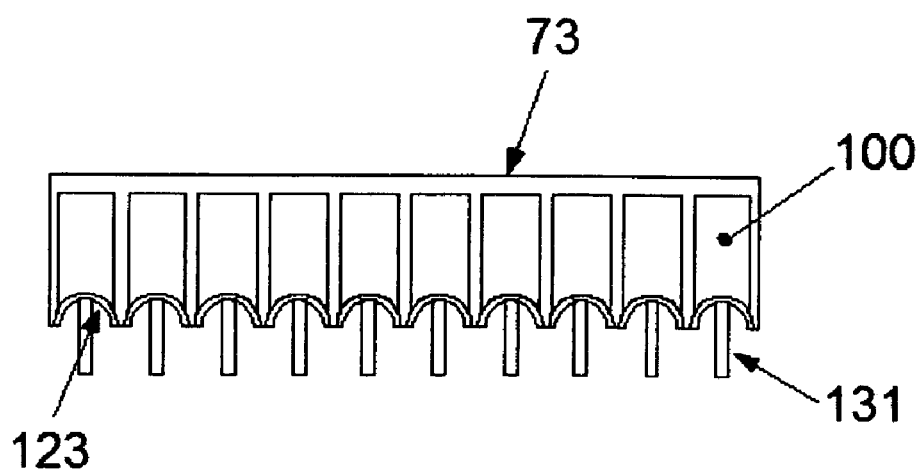

The connection method shown generally in FIG. 56B enables a self alignment option since the contacts that protrude from above the motherboard are contained within the arches of the castellations.

Figure 24:
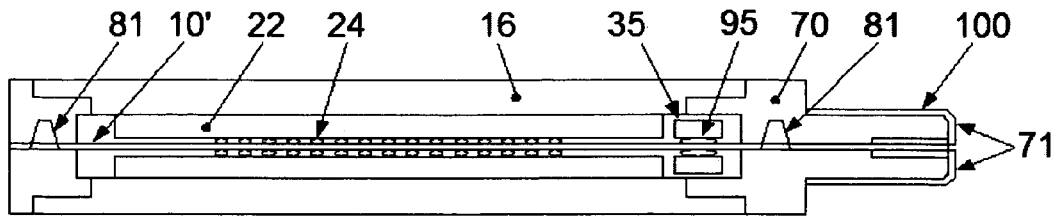
FIGS. 24-34 illustrate schematically various arrangements and features that can be incorporated into flex modules in accordance with the present invention.

FIG. 24 is a cross-section illustration of a centered flexible circuit substrate 10', containing semiconductor chips and passive chip devices on both surfaces, that is housed between two metal heat spreaders 16 that are incorporated within a molded plastic frame 70. The molded plastic frame includes tapered posts 81 in the bottom half that mate with corresponding recesses in the top half to enable proper placement and registration of the flexible circuit within the module for simplified assembly of the two molded frames together. The DIMM socket contact pads 100 on the outer surfaces of the molded plastic frames are incorporated onto both frame halves and electrically routed or connected to pads on the interior surfaces of the frames by two possible means: (a) wrap-around pads 71 that are embossed or thermal imprinted or otherwise transferred onto the surfaces of both halves of the plastic frames in a 3-dimensional manner such that a continuous electrical connection is made from the outer contact pads to inner pads across the bottom-edge thickness, and (b) thin metal wrap-around edge clips that are either molded in place or inserted after the plastic frames are molded. Electrical connections between the flexible circuit pads and the interior pads of the wrap-around or edge dip pads are formed using one of several means; (a) either of a pressed mechanical contact, (b) anisotropic conductive adhesive (ACA) or isotropic conductive adhesive (ICA), (c) solder, (d) or metal plating.

Figure 25:
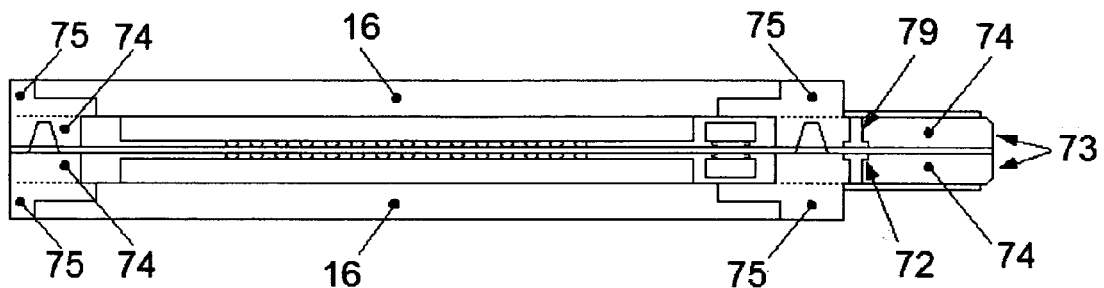

FIG. 25 illustrates another cross-section illustration similar in many respects to FIG. 24. However, the hollow frame in this embodiment consist of thin PWB frames 73 containing standard copper laminated and etched DIMM socket contact pads near the bottom edges of the outside surfaces that are electrically routed to the interior surface pads using conventional plated through holes 79. The two PWB frames are in turn over-molded with plastic rims or frames 70 that hold the metal heat spreading plates 16 to the PWB frames 73. Plastic tapered posts 81 are also molded to the inner surface of the bottom half of the PWB frames, intended to mate with corresponding recesses drilled into the top half of the PWB frame to enable proper placement and registration of the flexible circuit within the module and simplified assembly of the two frames as previously mentioned. Electrical connection is established between the flexible circuit pads and the interior through-hole or via-hole plated pads 72 by either of the means previously mentioned for FIG. 24.

Figure 26:
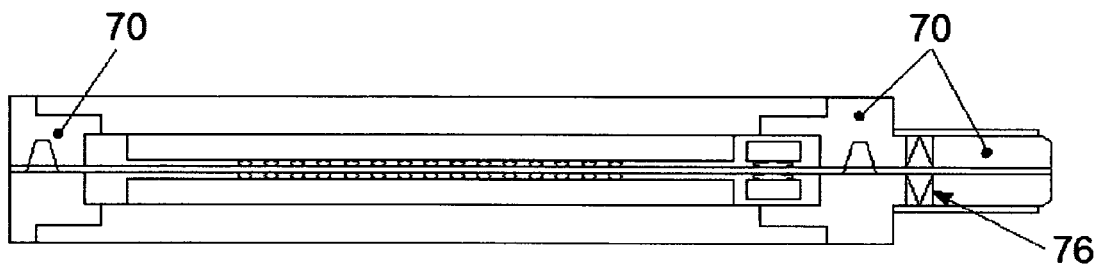

FIG. 26 illustrates another cross-section embodiment similar to FIGS. 24 and 25 in which electrical connections between the exterior DIMM contact pads and the interior flexible circuit pads is accomplished by means of press-fitted, piercing contacts 76 that are inserted into molded slots within the molded plastic frames. These piercing contacts would establish electrical contact with the flex circuit pads by mechanical means when the molded halves of the hollow frames are assembled together.

Figure 27:
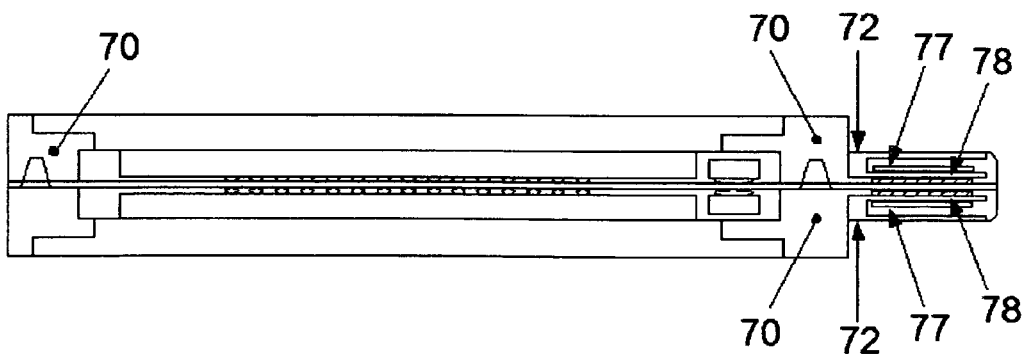

FIG. 27 illustrates in cross section yet another embodiment in which the center flexible circuit 10' is electrically connected to the external DIMM contact pads by means of a thin ACA layer 78. Both halves of the plastic molded frame 70 contain plated through-hole connections 79 and contact pads 72 with integral thin film tungsten resistive heater elements 77 located beneath the interior pads to enable the ACA to be thermally bonded between the interior contacts pad of the flex circuit and plastic molded frame following assembly. When an electrical current is applied to designated pins of an assembly or manufacturing socket the integral heater elements provided a source for internal heat to activate the ACA adhesive which, together with the applied normal forces of the socket pins, enables electrical connections for each contact pad pair to be established.

Figure 28:
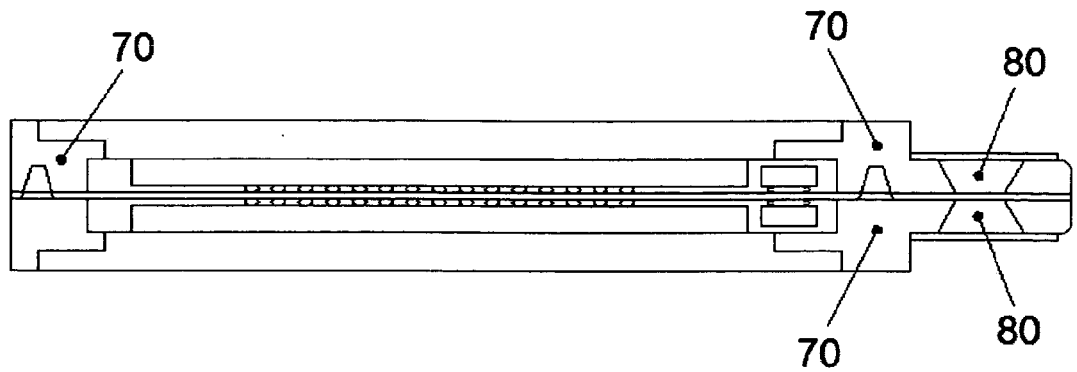

FIG. 28 illustrates in cross section yet another embodiment in which the center flexible circuit 10' is electrically connected to the external DIMM contact pads which consist of formed or stamped metal "T" shaped contacts 80 that are either molded in place or inserted into molded slots within the plastic frames. These metal contacts penetrate through the thickness of the molded plastic and make direct contact with the pads of the flexible circuit following assembly of the frames on either side of the center flexible circuit substrate.

Figure 29:
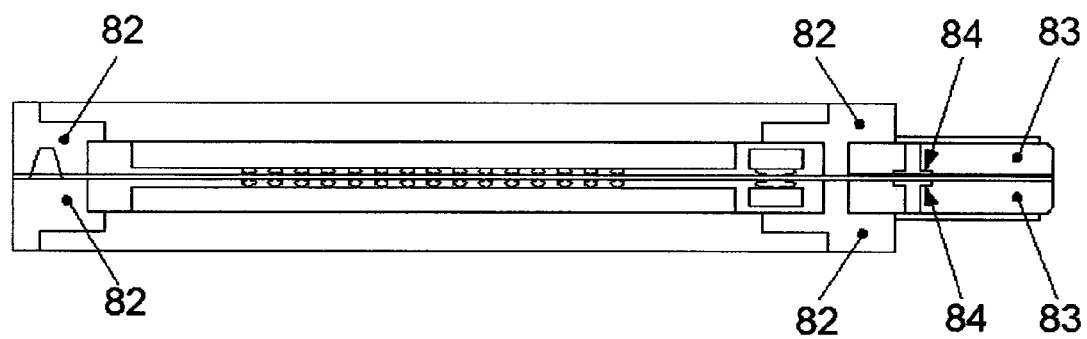

FIG. 29 illustrates in cross section shows yet another embodiment in which thin PWB strips 83, that contain the proper DIMM socket contacts 100 are simultaneously soldered to the center flexible circuit when the memory components and passive chips are assembled onto the surfaces. The substrate subassembly is then subsequently housed within a metal frame 82 enclosure that captures and holds the top edges of the PWB strips. The PWB strips contain standard etched-copper and solder-coated contact pads and plated through-holes 84 that electrically and mechanically mate with the pads arrayed on the flexible circuit by means of fusible solder alloys that are reflowed at the same time as other SMT components are assembled in place. The metal frame 82 is then subsequently assembled around the flex circuit subassembly to protect the components and to firmly grasp and engage with the PWB strips, which are bonded together with an adhesive (e.g. PSA) or low-temperature solder alloy.

Figure 30:
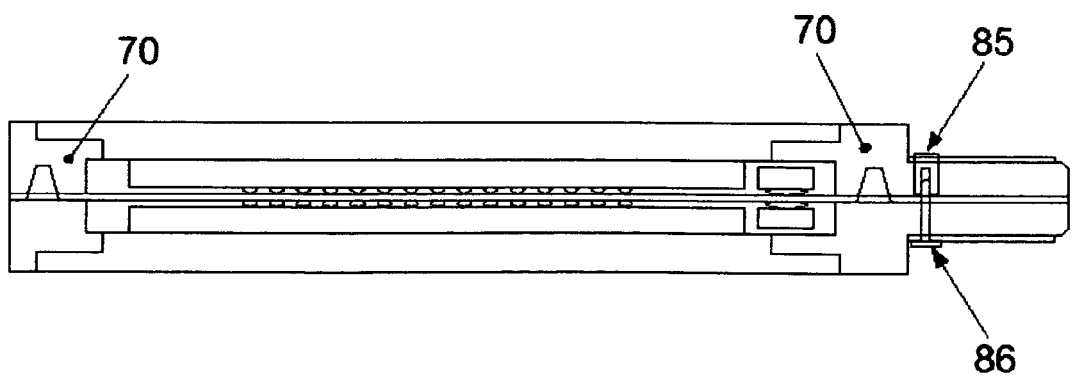

FIG. 30 illustrates in cross section yet another embodiment, similar to FIG. 29, in which the separate halves of the molded plastic frame 70 contain an array of pins 86 and sockets 85 along the edge that electrically connect with the flex circuit pads and the external DIMM contact pads. The array of pins and sockets are either molded in place during fabrication of the molded frames or inserted into molded-in slots or holes.

Figure 31:
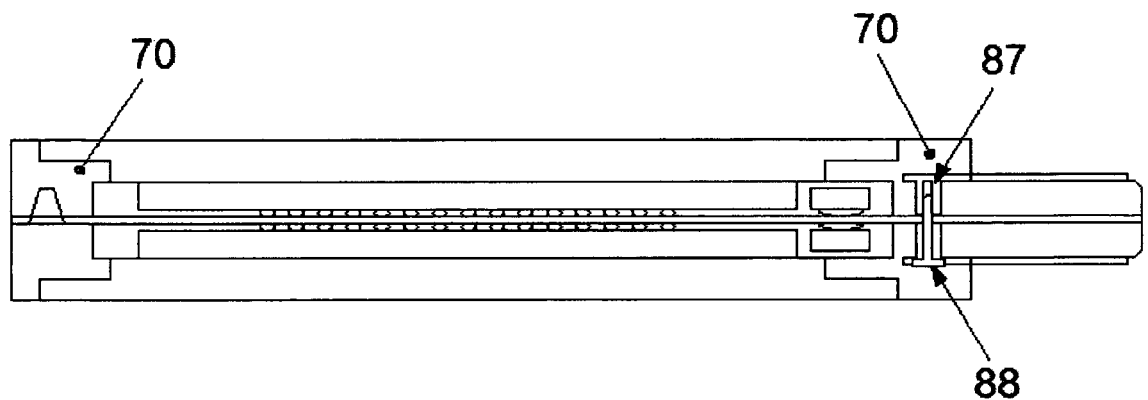

FIG. 31 illustrates in cross section yet another embodiment, similar to FIG. 27, in which one half of the molded plastic frame 70 contains an array of pins 88 along the edge that are pressed fitted into plated through-holes 87 before being over-molded with more plastic (i.e. "buried" within the plastic frame). These pins in turn mate with pads of the flexible circuit and with plated through-holes 87 of the opposite half of the frame 70.

Figure 32:
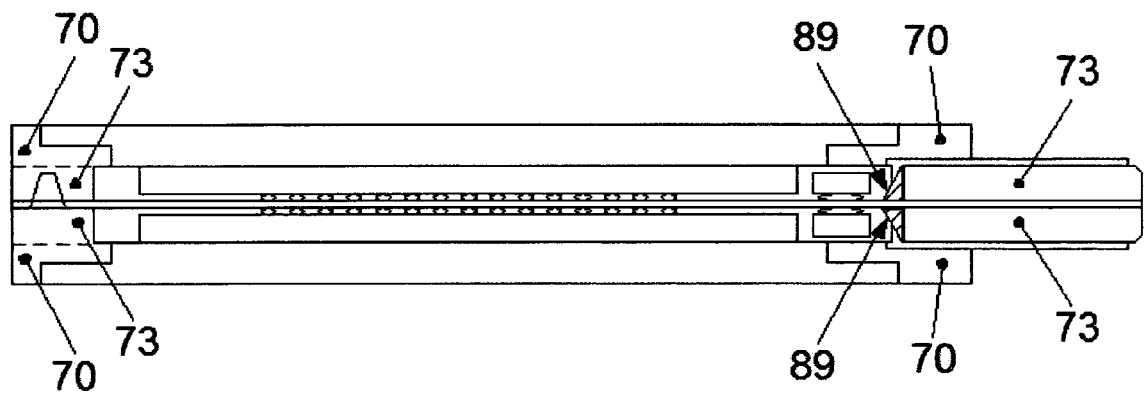
Figure 53:
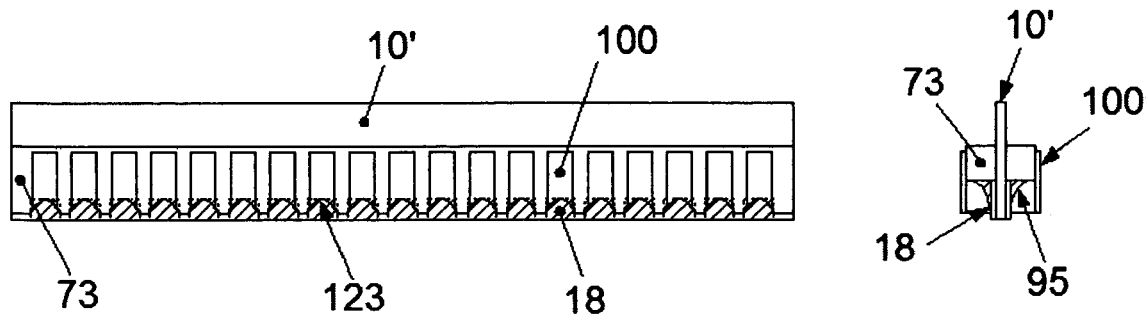
FIG. 53 illustrates schematically a multichip module having castellations on the external contact pads according to another aspect of the invention.

FIG. 32 illustrates in cross section yet another embodiment, similar to FIGS. 25 and 53, in which two thin PWB frame-halves 73 include an array of castellated plated through-holes 89 along an inside edge of the hollow frame to enable electrical connections between the external DIMM socket contact pads 100 and the flexible circuit 10' sandwiched between the PWB frame-halves 73. The PWB frame sections also include over-molded plastic rims or frames 70 that bond the metal heat spreaders 16 to the PWB frames. Solder that is pre-applied inside the castellated holes 89 is reflowed during assembly of the frames to provide electrical joining of the external contact pads with the pads 100 of the flexible circuit substrate.

Figure 33:
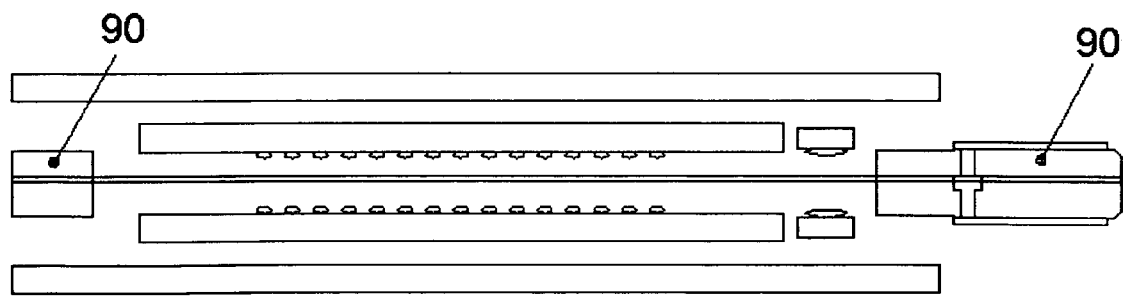

FIG. 33 illustrates an exploded cross section view of yet another embodiment, in which the flexible circuit is laminated within the PWB frame halves as a "rigid-flex" circuit card or substrate 90 that includes conventional plated via connections between the external DIMM socket contact pads and the internal flex circuit pads. No molded plastic is shown, although it can be optionally added, and the metal heat spreading plates 16 are attached directly to the PWB frames using an adhesive.

Figure 34:
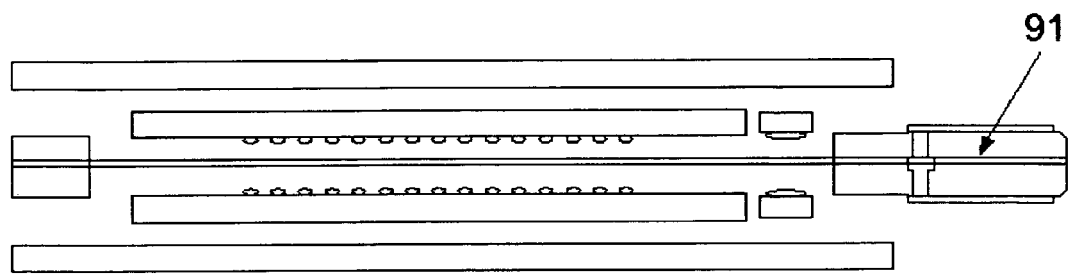

FIG. 34 is an exploded cross section view of yet another embodiment, similar to FIG. 33 except that a thin PWB 91 is substituted for a flexible circuit.

Figure 35:
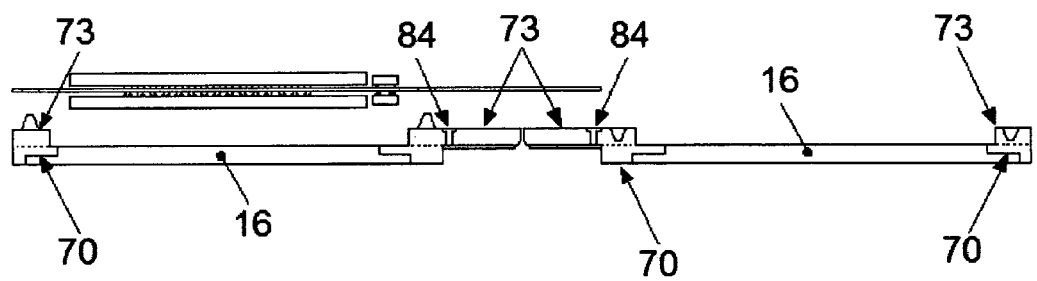
FIGS. 35-36 illustrate schematically a foldable frame configured to contain a flex circuit according to the present invention.
Figure 36:
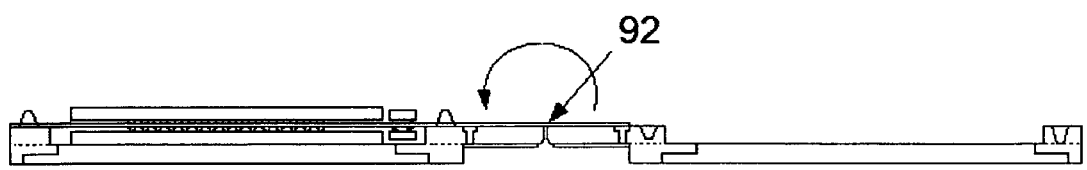

FIGS. 35 and 36 illustrate a step-wise sequence of an assembly process using frames similar to those described earlier for FIG. 25. An extended length of flexible circuit bridges across both halves of the pre-assembled foldable frames 92 that are abutted edge-to-edge. Pads on the bottom surface of the flexible circuit are electrically joined with pads on the interior surfaces of each half of the frame before folding the halves together into a final assembly. In this embodiment the flexible circuit also functions as a hinge about which the module halves can be folded into their final closed configuration.

Figure 37:
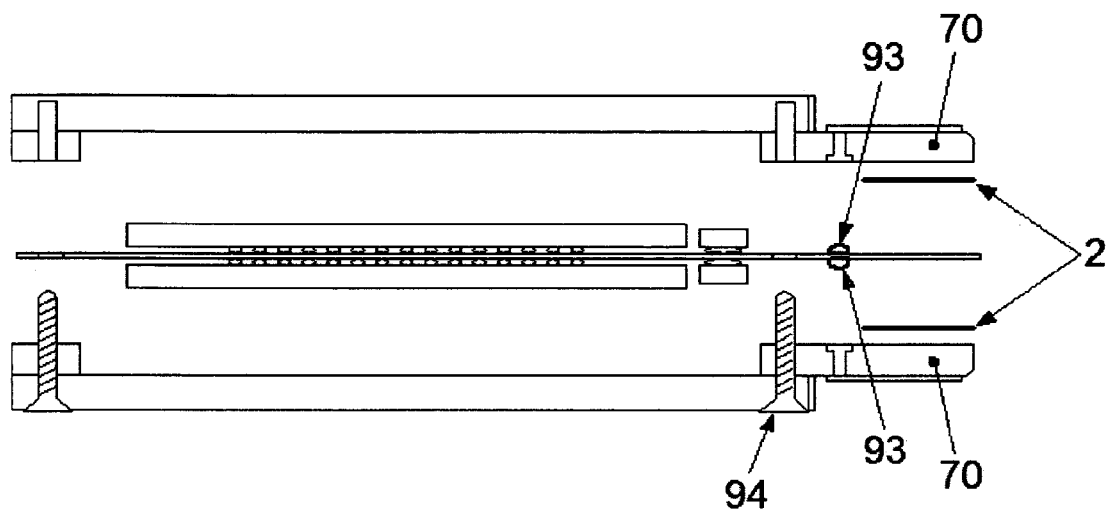
FIGS. 37-38 illustrate schematically two embodiments of the invention in which supporting frames are held together by mechanical screws and snaps respectively.

FIG. 37 shows an exploded cross section of yet another embodiment, similar to FIG. 30, in which threaded screws 94 are used to mechanically fasten the separate halves of the frames together. Solder bumps 93, pre-deposited onto the flexible circuit, are reflowed to provide electrical connections between the pads of the flexible circuits and the interior pads of the separate frames. A PSA adhesive 2 is also used to mechanically fasten the frames together.

Figure 38:
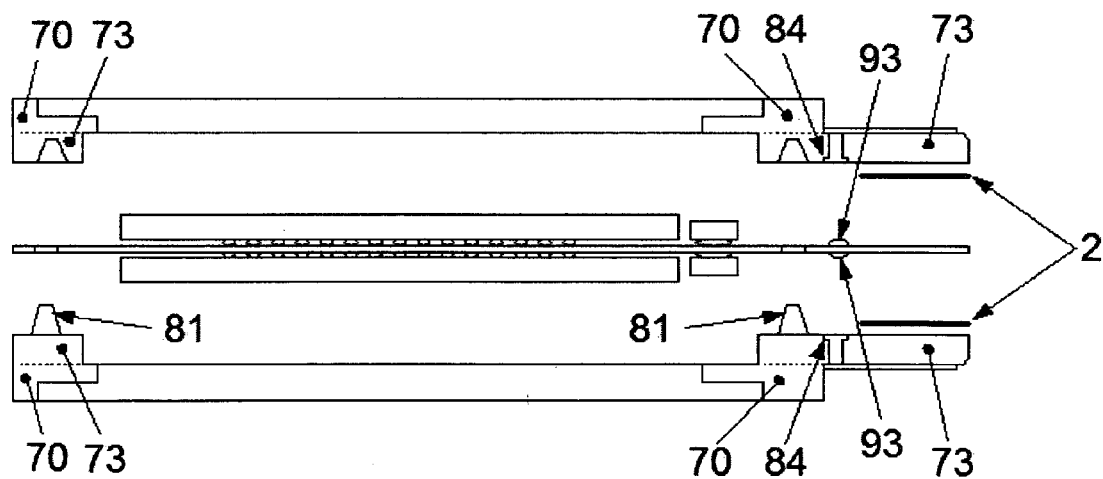

FIG. 38 is an exploded cross-section view similar to FIG. 25 to illustrate how solder bumps 93 can be pre-deposited onto the flexible circuit before the separate halves of the frames are assembled together. The solder is then reflowed to complete the electrical connections between the pads of the flexible circuits and the interior pads 72 of the separate frames. A PSA adhesive 2 is also used to mechanically fasten the frames together.

Figure 39:
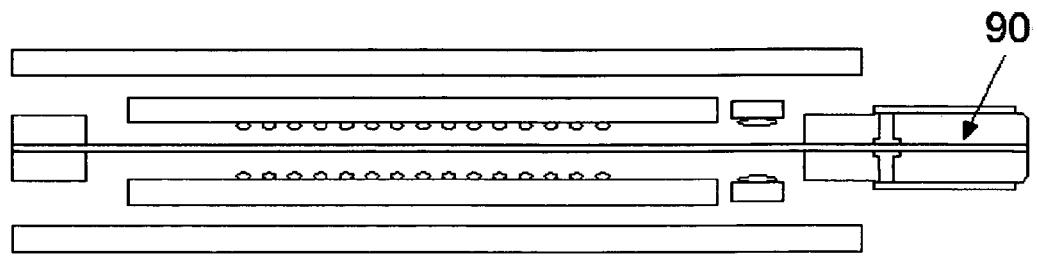
FIGS. 39-43 illustrate schematically various arrangements and features that can be incorporated into flex modules in accordance with the present invention.
Figure 40:
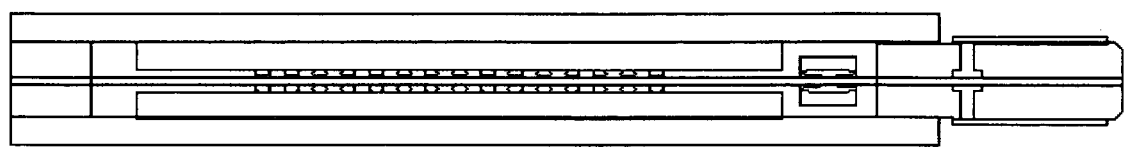

FIGS. 39 and 40 illustrate an exploded view and final assembly view of the "rigid-flex" circuit card or substrate 90 described earlier for FIG. 33.

Figure 41:
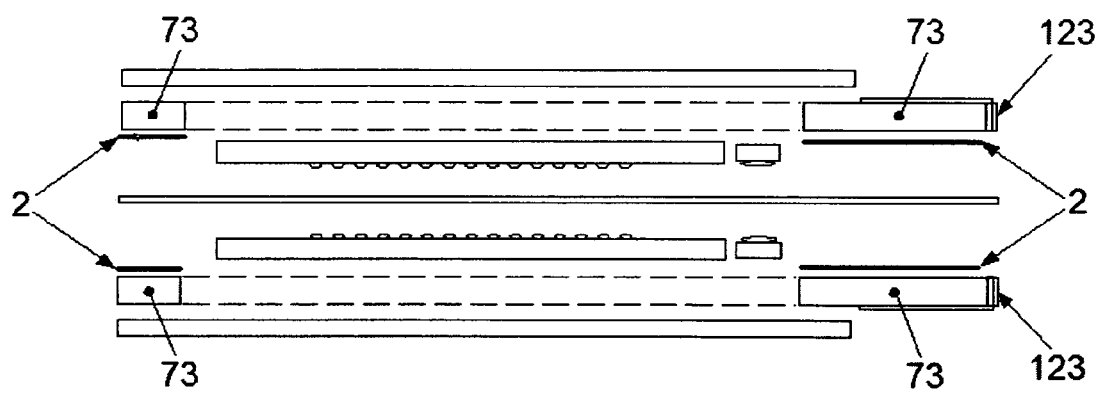
Figure 42:
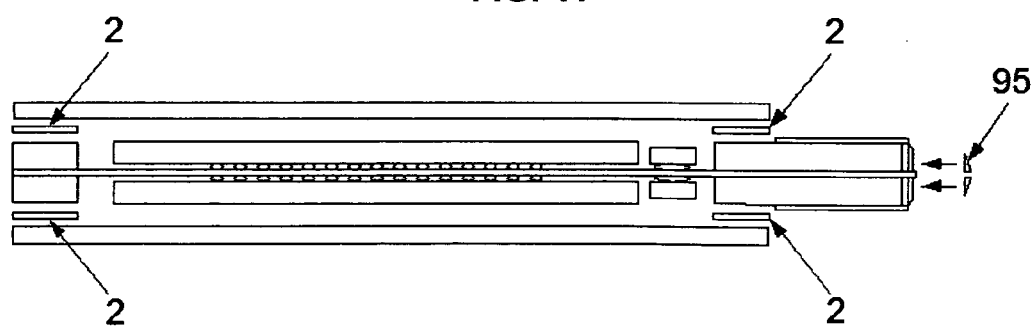
Figure 43:
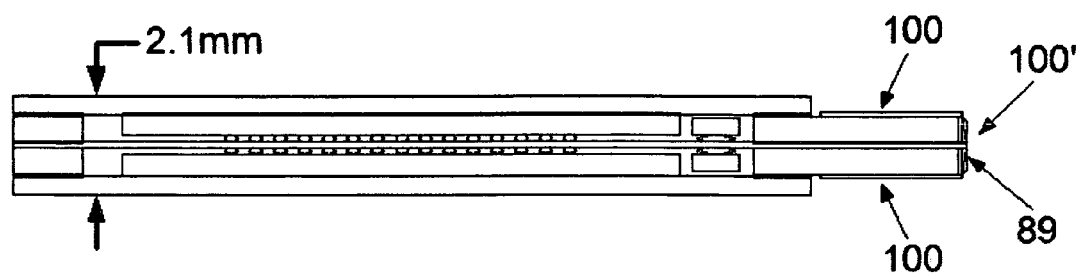

FIGS. 41-43 illustrate a step-wise sequence of the assembly process using frames similar to those described earlier for FIG. 33. In this embodiment the exterior DIMM contact pads 100 are solder connected 95 through castellated (partial remnants of plated through-holes) edge contacts 123 to the pads 18 of the flexible circuit as illustrated in FIG. 53. The flexible circuit 10' extends a short distance beyond the terminus of the castellated edge contacts 123 and provides an electrical insulation and physical barrier between the adjacent contacts of the separate halves of the PWB frames 73 so as to prevent direct solder bridging between these abutted contacts during final assembly. The bottom edge contacts 100' of the module are designed to be passed through a mini wave-solder fountain or into a solder pot to obtain the electrical connections 95 between the exposed flex circuit pads 18 and PWB castellated edge contacts 123. The resultant assembly measures approximately 2.1 mm in total thickness.

FIG. 45 is an exploded cross-section illustration of yet another embodiment, similar to FIG. 44, that uses two separate flexible circuits that are electrically interconnect to one another as described in the previous figure but which also uses contact bumps 24 or 97 or pads located at the extreme bottom edge that are not backed with an elastomeric material and which are folded 98 in an outward direction through only a 90-degree angle.

Figure 46:
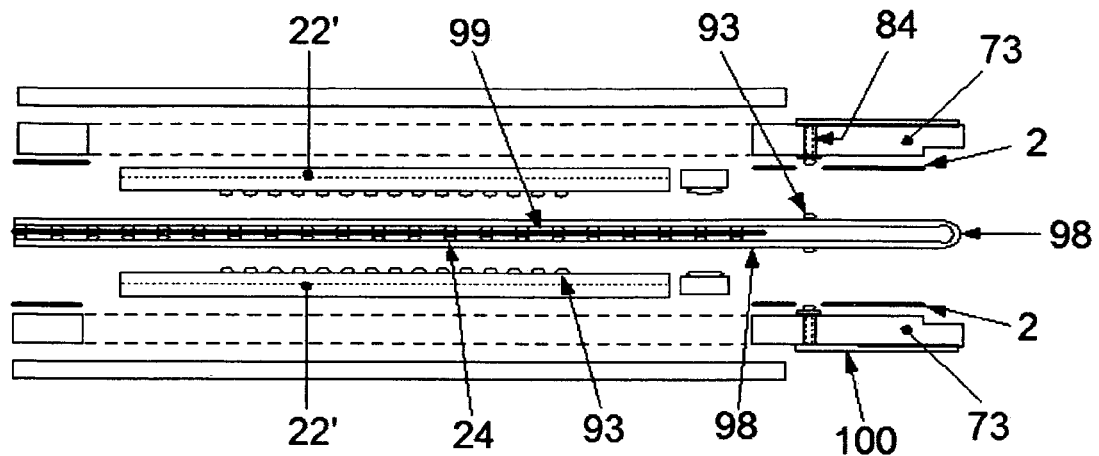

FIG. 46 is an exploded cross-section illustration of yet another embodiment, similar to FIG. 44, that uses a single flexible circuit folded 98 and interconnected upon itself, which illustrates means for electrical connection with an array of external DIMM contact pads 100 as previous discussed. This particular illustration details one possible means of electrical interconnection between the centrally located flexible circuit and the DIMM contact pads 100 of the PCB window-frames 73 using solder bumps or ACA adhesive film 99 and can be combined with the additional means for direct electrical interface of the module to the motherboard as described in FIG. 44.

FIG. 47A shows a planar view while FIGS. 47B and 48 show two cross-sectional views of embodiments that include a foldable jointed heat spreader 16 or cover plate subassembly or composite clam shell 110 consisting of PWB frame 73 or molded plastic window frames 70 and joined metal heat spreaders. These subassemblies, as previously described, include metal tabs 125 that enable the window frames and heat spreaders to be assembled together as a single, unified subassembly with integral hinge points to allow the subassemblies to be folded in a manner that encompasses like a clam shell the central single flexible circuit, FIG. 47B, or folded flex circuit 98, FIG. 48, previously wrapped around a central cooling core 124. As illustrated, the PWB or molded-plastic window frames can include recessed slots 126 along the top edges where the metal tabs are located to enable the tabs to be recessed flush or below the top edges of the window frames when folded together. The electrical interconnections between the single or folded flexible circuits and the external contacts 100 arrayed along the edges of the window frames have been previously described elsewhere and can be applied to these embodiments. Likewise, central cooling cores 124 compatible with these embodiments have been previously described and illustrated in earlier patent applications referenced above. In the cross-sectional view for FIG. 48, illustrated with a central cooling core 124, the jointed heat spreaders are spaced sufficiently apart to allow the cooling core to extend some distance above the top edges of the folded window frames. The extended core enables and additional and separate cooling tower 121, as illustrated, to be added to the top edge of the exposed cooling core 124 further improving the ability of heat to be extracted from the semiconductor devices mounted within. Therefore this embodiment enables internal heat to be advantageously removed in two major directions; from the most central chips into the cooling core 124 and towards the cooling vanes of the top cooling tower 121, and from the outermost chips directly towards the heat spreaders 16 on either side of the module. The heat is therefore extracted from this embodiment in a bidirectional manner.

In another embodiment of this invention the central cooling core 124 is of sufficient thickness and is extended an additional distance towards the bottom edge sufficient to enable properly dimensioned DIMM contacts pads 100 to be incorporated within the external surfaces of the folded flexible circuit 98. Alternatively, the folded flexible circuit 98 may incorporate bottom contact bumps or pads 24, 97 or 100 as previous described for FIG. 44.

Figure 49:
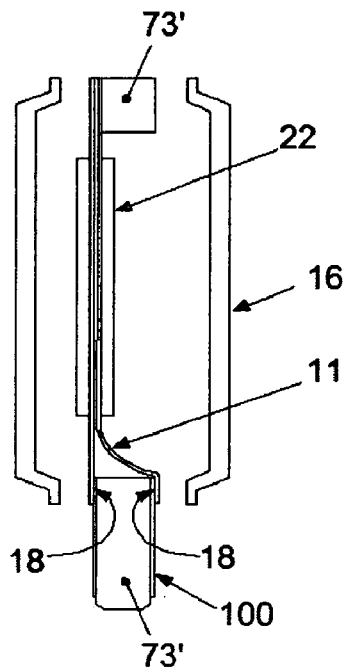
FIGS. 49-52 illustrate schematically several designs for multichip modules in accordance with various aspects of the present invention.

Referring now to FIGS. 49 and 52: In previous embodiments the PWB window frame 73 consists of two separate halves that sandwich the central flexible circuit 11 in the middle between them. However, an alternative PWB window frame 73' is represented in FIG. 49 that comprises a single member with an appropriate thickness and external contact pads 100 to properly engage with standard DIMM sockets. A bottom edge of the flexible circuit 11 is bifurcated and contains contact pads 18 disposed along the inner surface that are electrically and mechanically attached to pads 100 arrayed along an interior edge or recessed shelf(s) (not shown) of the window frame as illustrated in the cross-section views of FIGS. 49 and 52. The top portion of the flexible circuit may be mechanically attached to either the exterior surface of the PWB window frame, as illustrated in FIG. 49, or a recessed shelf routed within the window frame, as illustrated in FIG. 52. In FIG. 49 the flexible circuit is slightly off axis with respect to the centerline of the module, while in FIG. 52 the recessed shelf enables the flexible circuit to be positioned along the centerline. Though the flexible circuit terminates near the top of the external DIMM contact pads 100 of the window frames 73' for both FIGS. 49 and 52, the flexible circuit may also be extended to the bottom edge of the window frames (not shown) to incorporate DIMM contact pads within the outer surfaces of the bifurcated portions of flexible circuit 11. Alternately, the window frame may also consist of only the bottom portions illustrated in FIGS. 49 and 52 and use the upper flanges of the metal heat spreaders 16 to capture and hold the top edges of the flexible circuit (not shown).

Figure 50:
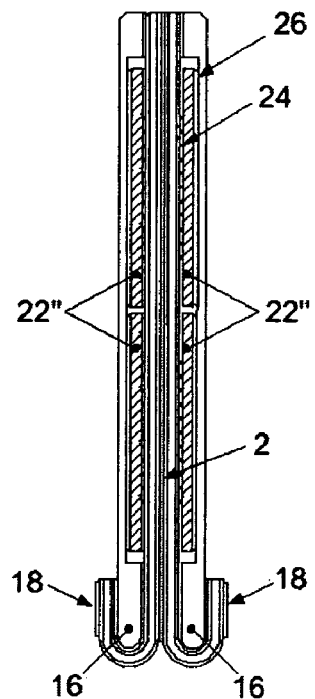
Figure 51:
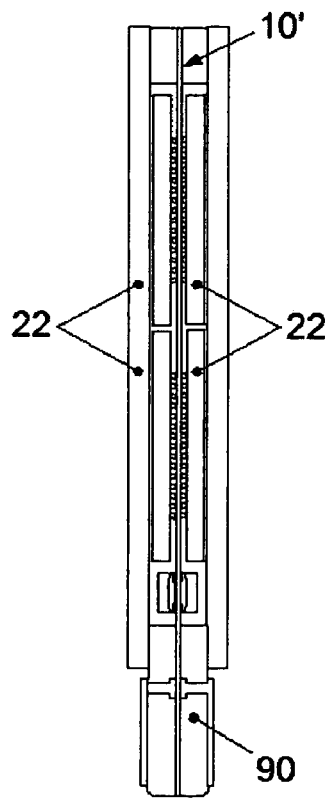

FIGS. 50 and 51 are similar to FIGS. 6A and 32 and have been previously described in their respective paragraphs. They are included to illustrate examples of modules with double-rows of semiconductor devices enclosed within the exterior metal shells 16. FIG. 52 also includes a double-row of enclosed semiconductor devices.

FIG. 53 illustrates another embodiment in which the central flexible interconnecting substrate 10' is either flush or extends a short distance beyond the lower edges of the hollowed PWB frames 73, which are sandwiched on both sides of the flexible substrate and which contain DIMM-type copper clad contact pads 100 on the outer surfaces. The extreme bottom edges of the hollowed frames contain an array of metallized castellations 123 (crescent shaped or scalloped copper plated through holes) that electrically bridge across the thickness of the frames and enable the exterior PWB contact pads 100 to be electrically connected with interior pads 18 arrayed on the either side of the central flexible substrate 10'. The metallized castellations are electrically connected to the pads of the interconnecting substrate using either solder 95 or electroplated connections.

Figure 54:
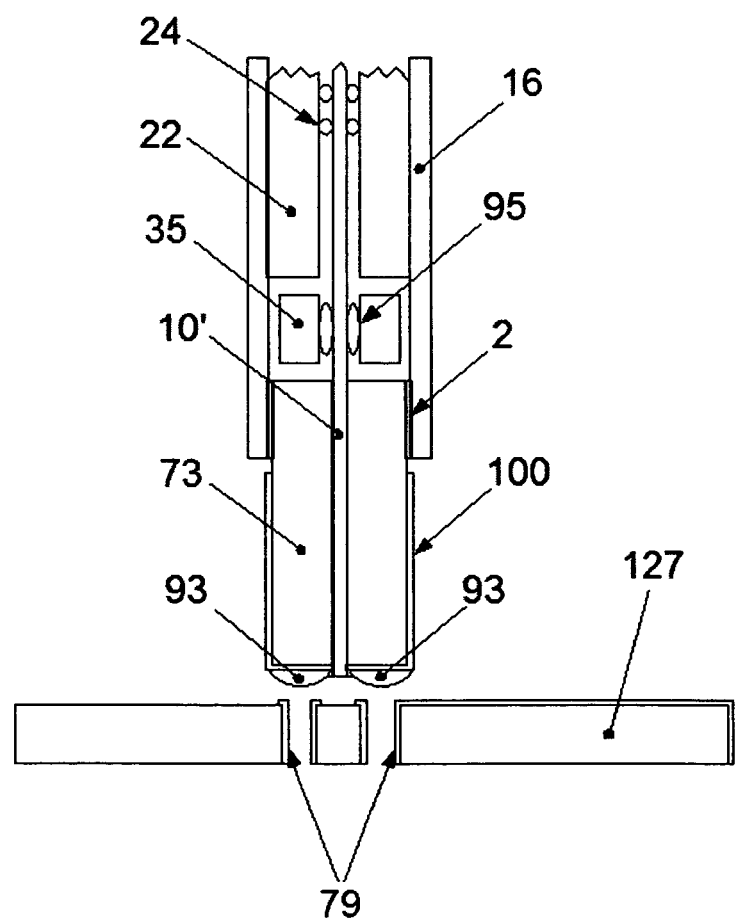
FIG. 54 illustrates schematically in cross section a multichip module according to one aspect of the invention, which is suitable for attaching to a motherboard by soldering to plated through-holes.
Figure 55A:
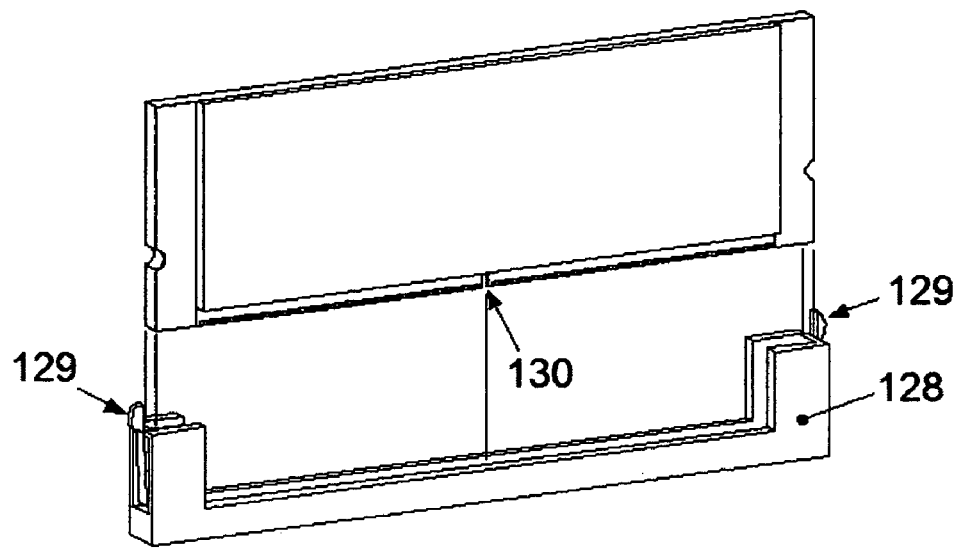
FIG. 55 illustrates schematically a low insertion force socket arrangement according to another aspect of the invention.
Figure 55B:
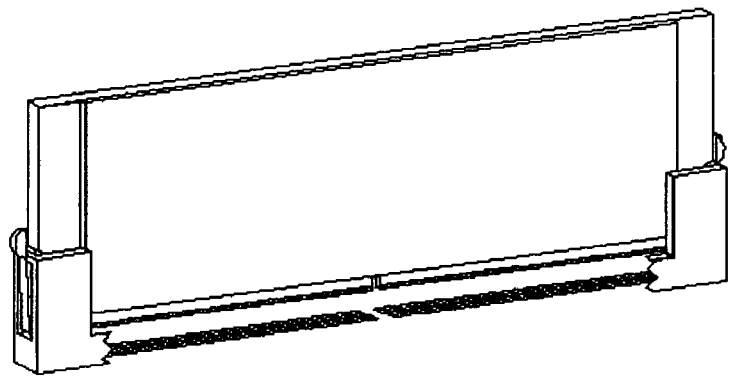
Figure 55C:
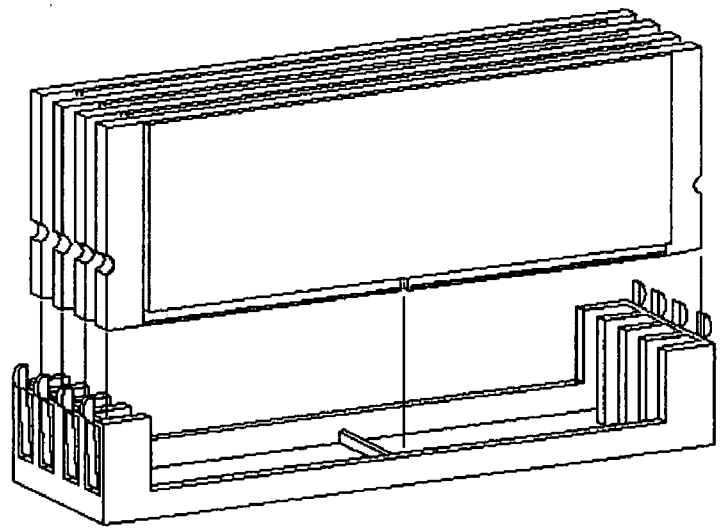

Referring now to FIG. 54: When the solder bumps 93 or plated bumps 97 are increased in size sufficient to extend beyond the edges of the module they may be used to establish direct electrical contact with the motherboard 127. The motherboard contacts are either surface pads or preferably plated through holes 79 that are of sufficient diameter to enable the bumped contacts of the module to self-center within the holes. Providing bumped structures on the extreme bottom edge of the module allows the module to rest directly against the motherboard with a "zero seating plane", thereby reducing the module height approximately 3-4 mm. This design also eliminates the necessity for socket pins to make electrical contact with pads 100 arrayed along both bottom sides of the module, as is currently practiced, and eliminates the need to solder such pins to the motherboard. The module of this embodiment is instead held in compression against the pads or plated through-holes of the motherboard through use of a new "pinless" vertical contact socket, as illustrated in FIGS. 55A-C. By this means the electrical path from the motherboard to the module is significantly reduced in distance, improving the signal integrity of the module-to-motherboard interface by eliminating a source for electrical discontinuities.

FIG. 55 illustrates a new "Pinless" socket 128 designed to clamp or lock modules similar to those described in FIGS. 41-44 and 53 in direct contact and in compression against pads or plated through-holes 79 arrayed upon the motherboard 127 as shown in FIG. 54. The socket contains locking clamps (not shown) that are press-fitted or soldered into motherboard to mount the socket onto the motherboard and latching mechanisms 129 for locking and holding the bottom edges of the modules firmly against the motherboard. By releasing the latching mechanisms the modules can be extracted from the socket guide rails that are used to orient the modules with respect to the motherboard contacts. When the modules are inserted into the guide rails and pressed firmly against the surface of the motherboard the same latching mechanism engages with the ends of the module and locks the module in a state of compression against the surface of the motherboard. A metal or plastic bar located near the bottom center of the socket engages with a centering slot 130 within the bottom edge of the module and also provides a means for accurately locating the module with respect to the motherboard contacts.

Referring now to the cross-section view, FIG. 56A, and planar view, FIG. 56B, of the bottom edge of the module of FIG. 55: An alternative module-to-motherboard interface makes use of very thin and low profile pins 131 within a socket to contact the copper plated walls within the scalloped or "castellated" edges 123 of the module of FIG. 53. This connection method enables a self alignment option since the contacts 131 that protrude from above the motherboard or from a low-profile DIMM socket are contained within the arches of the castellations, as shown in FIG. 56B. The thin "bladed" socket pins 131 would tend to self-center at the top of the arch within the castellations 123 and prevent the pins from shifting and shorting against adjacent contacts on the edge of the module.

Figure 11:
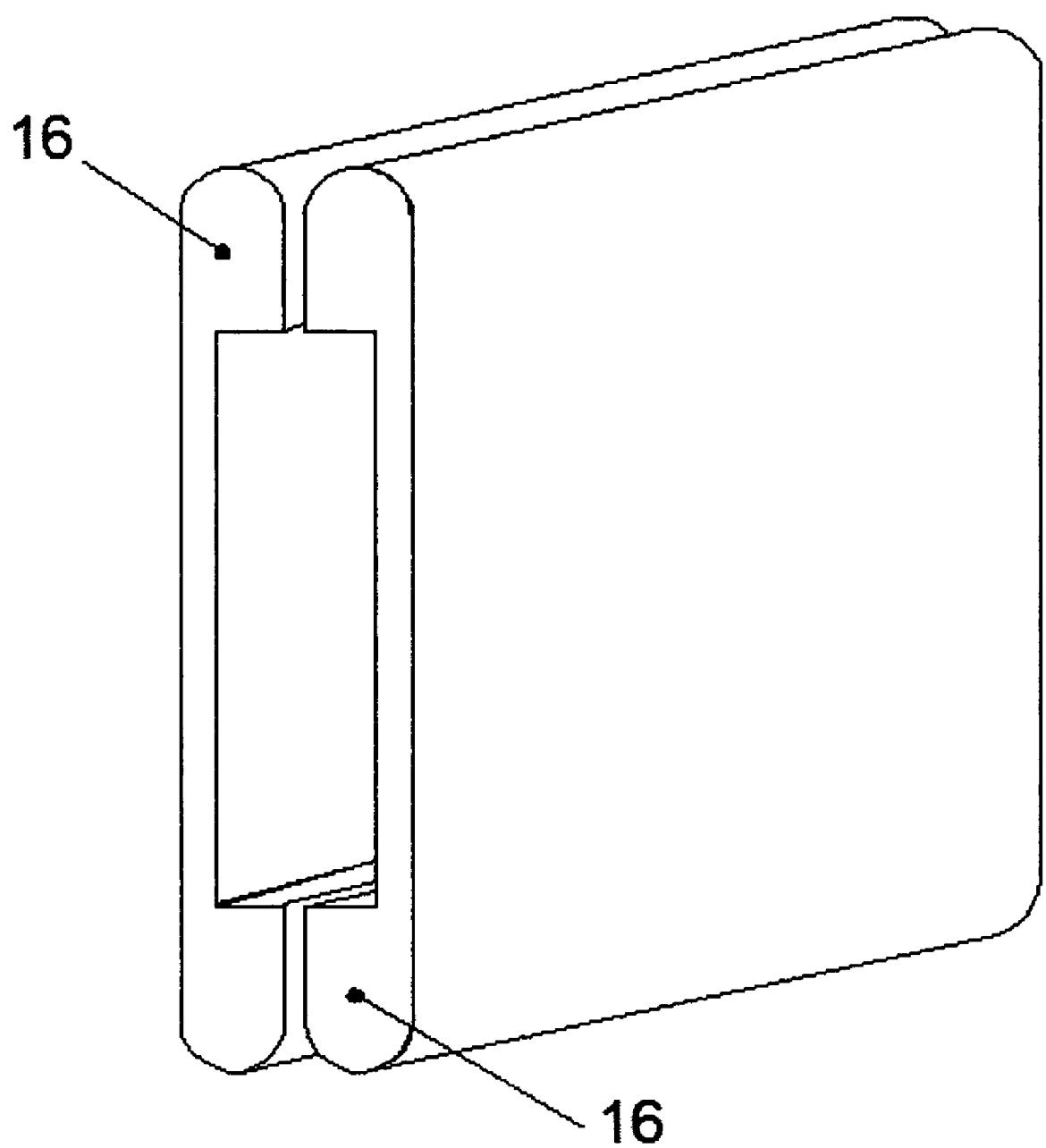
FIG. 11 illustrates a stiffener with hollowed-out areas in accordance with one aspect of the invention.
Figure 57:
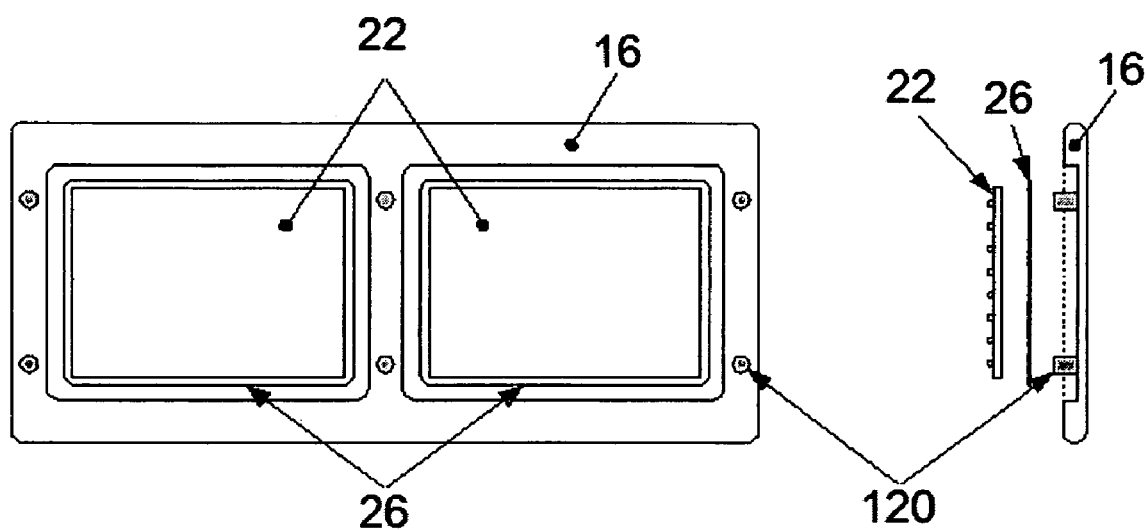
FIG. 57 illustrates schematically the incorporation of posts or spacers in the module to protect the semiconductor devices from stresses according to another aspect of the invention.

FIG. 57 generally illustrates a metallic clam shell similar to FIG. 11; the two halves of which are mirror images of each other. The metallic structure has provisions for thermal pads 26 as well as spacers 120 for preventing the chips 22, 22' or 22" from crushing against each other during handling of the final assembly as represented in FIG. 6A or 10.

Glossary
Adhesive 2
Single or separate ply 4
Bifurcated plies 4
Two plies can be spaced apart 5
End of adhesive coverage 6
Outer copper patterns 7
Copper patterns 8
Interior copper patterns or ground plane 9
Bifurcated Multilayer flexible circuit 10
Bifurcated Multilayer flexible circuits on both top and bottom edges 10a
Non Bifurcated Multilayer Flex 10'
Folded Non Bifurcated Multilayer Flex 10"
Central Bifurcated multilayered flex circuit with external contact pads 11
Polyimide core dielectric 12
Adhesive material-dielectric 14
Electrically conductive adhesive 14'
Stiffener, Heat Spreader, Exterior Metal Shell, Metallic Enclosure, Metal Plate 16
U-Shaped Stiffener 16'
Solid Stiffener 16"
Edge card contact pads 18
Contact pads at the tip of the bend of the flex 18'
Inter Modular Connection Pads (18 or 18' in conjunction with conductive adhesive) 18"
Edge card connector 20
Semiconductor chips or Integrated Devices 22
Stacked Die 22'
Bare Die 22"
Array of bump contacts 24
Compliant Thermal conductor pad or Interface Material 26
Card edge connector using a bifurcated flex circuit 30
Passives 35
Integrated or Embedded Passives 35'
Very thin memory module 40
Conventional or Standard DIMM Socket or Connector 50
Molded Plastic or Hollow Frame 70
Wrap-around contact pads or edge clip 71
Plated via-hole with pads 72
PCB Frame 73
Standard DIMM thickness PWB Frame 73'
Layer 1 PCB 74
Layer 2 molded plastic 75
Piercing, press-fitted contact 76
Resistive heater element 77
Plated via hole 79
Metal "T" contacts 80
Molded tapered post 81
Metal frame 82
Thin PCB strips 83
Thru-hole vias with soldered plated pads 84
Inserted Socket 85
Pin 86
Buried Through Hole Via 87
Buried Press Fitted Pin 88
Solder in half-routed (castellated) thru-via connection 89
Rigid Flex Circuit Card or Substrate 90
Thin PCB 91
Foldable Frame bridged with flex circuit 92
Solder Bump or Ball Contacts 93
Fastening Mechanism 94
Solder Connection 95
Elastomeric material 96
Plated Bumps 97
Folded Flex Circuit 98
Isotropic or Anisotropic Conductive Adhesive 99
DIMM Socket Contact Pads 100
Bottom Edge Contacts or Pads 100'
Composite Clam Shell 110
Spacer 120
Cooling Tower 121
Staggered Bifurcation 122
PWB Castellated Edge Contacts 123
Cooling Core or Chamber 124
Metal Tab 125
Recessed Slot 126
Motherboard 127
Pinless Socket 128
Latch 129
Centering Slot 130
Low Profile Socket Pins 131

We claim:

1. A multichip module comprising:
    a flexible multilayer dielectric substrate having a first surface and a second surface;
    a conductive pattern on said first surface, said conductive pattern including a plurality of contacts adjacent to one edge of said substrate;
    a conductive pattern on said second surface, said conductive pattern including a plurality of contacts adjacent to said one edge of said substrate;
    a plurality of microelectronic devices attached to said substrate and operably coupled to said conductive patterns; and,
    two substantially rigid frames extending around the periphery of said dielectric substrate, one on each of said first and second surfaces, said frames having a plurality of metallized castellations aligned with and electrically connected to respective contacts on said substrate.

2. The multichip module of claim 1 wherein said microelectronic devices are selected from the group consisting of: memory circuits, logic circuits, buffer devices, interface devices, optoelectronic devices, active and passive RF devices, and microprocessors.

3. The multichip module of claim 1 wherein said frames further comprise heat spreading covers.

4. The multichip module of claim 3 wherein said covers provide electrical shielding.

5. The multichip module of claim 1 wherein said frames are connected to one another along a selected fold axis so that by folding about said axis said rigid frames may be brought together to enclose said flexible multilayer dielectric substrate.

6. The multichip module of claim 1 wherein said metallized castellations are configured to engage respective pins in a mating socket.

7. The multichip module of claim 1 wherein the side edges of said frames are configured to engage guide rails in a socket and said socket is configured to hold said castellations in contact with corresponding pins on a motherboard.

8. A method for making a multichip module comprising the steps of:
    forming a flexible dielectric substrate having a first surface and a second surface;
    forming a conductive pattern on said first surface, said conductive pattern including a plurality of contacts adjacent to one edge of said substrate;
    forming a conductive pattern on said second surface, said conductive pattern including a plurality of contacts adjacent to said one edge of said substrate;

attaching a plurality of microelectronic devices to said substrate and operably coupled to said conductive patterns; and, attaching two substantially rigid frames extending around the periphery of said dielectric substrate, one on each of said first and second surfaces, said frames having a plurality of metallized castellations aligned with respective contacts on said substrate.

9. The method of claim 8 wherein said rigid frames are attached to said dielectric substrate by adhesive bonding.

10. The method of claim 8 wherein said substrate is extended beyond the castellated edge of said frames.

11. The method of claim 10 further comprising the step of:

passing the castellated edge of said frame through a solder bath to form a solder connection between each of said metallized castellations and its respective contact on said substrate.

* * * * *